(12) United States Patent
Goto et al.

(10) Patent No.: US 11,710,641 B2
(45) Date of Patent: Jul. 25, 2023

(54) KIT, COMPOSITION FOR FORMING UNDERLAYER FILM FOR IMPRINTING, PATTERN FORMING METHOD, AND METHOD FOR MANUFACTURING SEMICONDUCTOR DEVICE

(71) Applicant: FUJIFILM Corporation, Tokyo (JP)

(72) Inventors: Yuichiro Goto, Haibara-gun (JP); Naoya Shimoju, Haibara-gun (JP); Akihiro Hakamata, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 267 days.

(21) Appl. No.: 16/992,481

(22) Filed: Aug. 13, 2020

(65) Prior Publication Data

US 2020/0373167 A1 Nov. 26, 2020

Related U.S. Application Data

(63) Continuation of application No. PCT/JP2019/004931, filed on Feb. 13, 2019.

(30) Foreign Application Priority Data

Feb. 14, 2018 (JP) .................... 2018-023834

(51) Int. Cl.
*H01L 21/308* (2006.01)
*G03F 7/038* (2006.01)
*H01L 21/027* (2006.01)

(52) U.S. Cl.
CPC .......... *H01L 21/3081* (2013.01); *G03F 7/038* (2013.01); *H01L 21/0273* (2013.01); *H01L 21/3086* (2013.01)

(58) Field of Classification Search
CPC ............. H01L 21/3081; H01L 21/0273; H01L 21/3086; G03F 7/038
See application file for complete search history.

(56) References Cited

U.S. PATENT DOCUMENTS

2014/0220353 A1    8/2014   Kodama et al.
2016/0009945 A1    1/2016   Enomoto et al.
(Continued)

FOREIGN PATENT DOCUMENTS

JP    2013-093552 A    5/2013
JP    2014-90133 A    5/2014
(Continued)

OTHER PUBLICATIONS

Office Action dated Mar. 2, 2021 in Japanese Application No. 2020-500495.
(Continued)

*Primary Examiner* — Walter H Swanson
(74) *Attorney, Agent, or Firm* — Sughrue Mion, PLLC

(57) ABSTRACT

Provided is a kit including a curable composition for imprinting, and a composition for forming an underlayer film for imprinting, in which the composition for forming an underlayer film for imprinting contains a polymer having a polymerizable functional group, and a compound in which the lower one of a boiling point and a thermal decomposition temperature is 480° C. or higher and ΔHSP, which is a Hansen solubility parameter distance from a component with the highest content contained in the curable composition for imprinting, is 2.5 or less. Furthermore, the present invention relates to a composition for forming an underlayer film for imprinting, a pattern forming method, and a method for manufacturing a semiconductor device, which are related to the kit.

22 Claims, 2 Drawing Sheets

(56) References Cited

U.S. PATENT DOCUMENTS

| | | |
|---|---|---|
| 2016/0211143 A1 | 7/2016 | Kitagawa et al. |
| 2017/0154766 A1* | 6/2017 | Ogihara .................. G03F 7/38 |
| 2017/0184959 A1 | 6/2017 | Honma et al. |
| 2017/0285465 A1 | 10/2017 | Iimura et al. |
| 2018/0037688 A1 | 2/2018 | Goto et al. |
| 2020/0109305 A1 | 4/2020 | Goto et al. |

FOREIGN PATENT DOCUMENTS

| | | |
|---|---|---|
| JP | 2015-70145 A | 4/2015 |
| JP | 2016-028419 A | 2/2016 |
| JP | 2016-115921 A | 6/2016 |
| JP | 2016-146468 A | 8/2016 |
| JP | 2017-055108 A | 3/2017 |
| KR | 10-2015-0126630 A | 11/2015 |
| TW | 201439181 A | 10/2014 |
| WO | 2016/152597 A1 | 9/2016 |
| WO | 2017/170697 A1 | 10/2017 |
| WO | 2018/230488 A1 | 12/2018 |

OTHER PUBLICATIONS

International Search Report dated Apr. 23, 2019, issued by the International Searching Authority in application No. PCT/JP2019/004931.

Written Opinion dated Apr. 23, 2019, issued by the International Searching Authority in application No. PCT/JP2019/004931.

International Preliminary Report on Patentability dated Aug. 18, 2020, issued by the International Bureau in application No. PCT/JP2019/004931.

Office Action dated Aug. 10, 2021 in Japanese Application No. 2020-500495.

Office Action dated Jan. 5, 2022, issued by the Korean Intellectual Property Office in Korean application No. 10-2020-7023132.

Office Action dated May 26, 2022 issued by the Taiwanese Patent Office in Taiwanese Application No. 108104376.

* cited by examiner

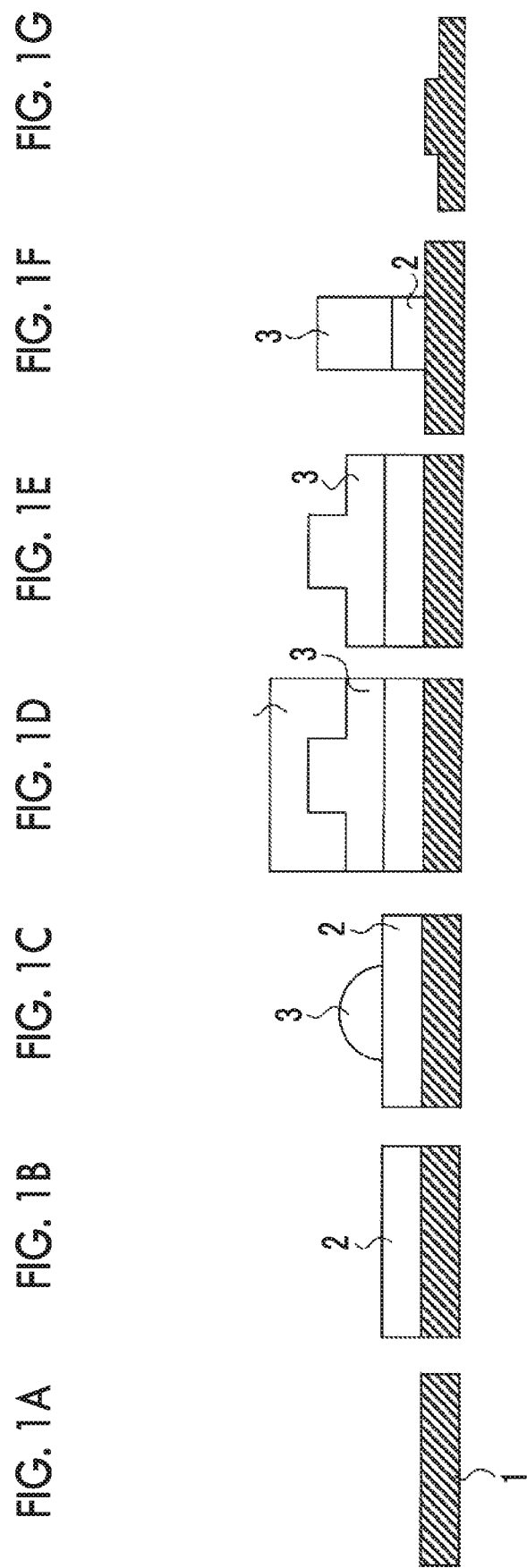

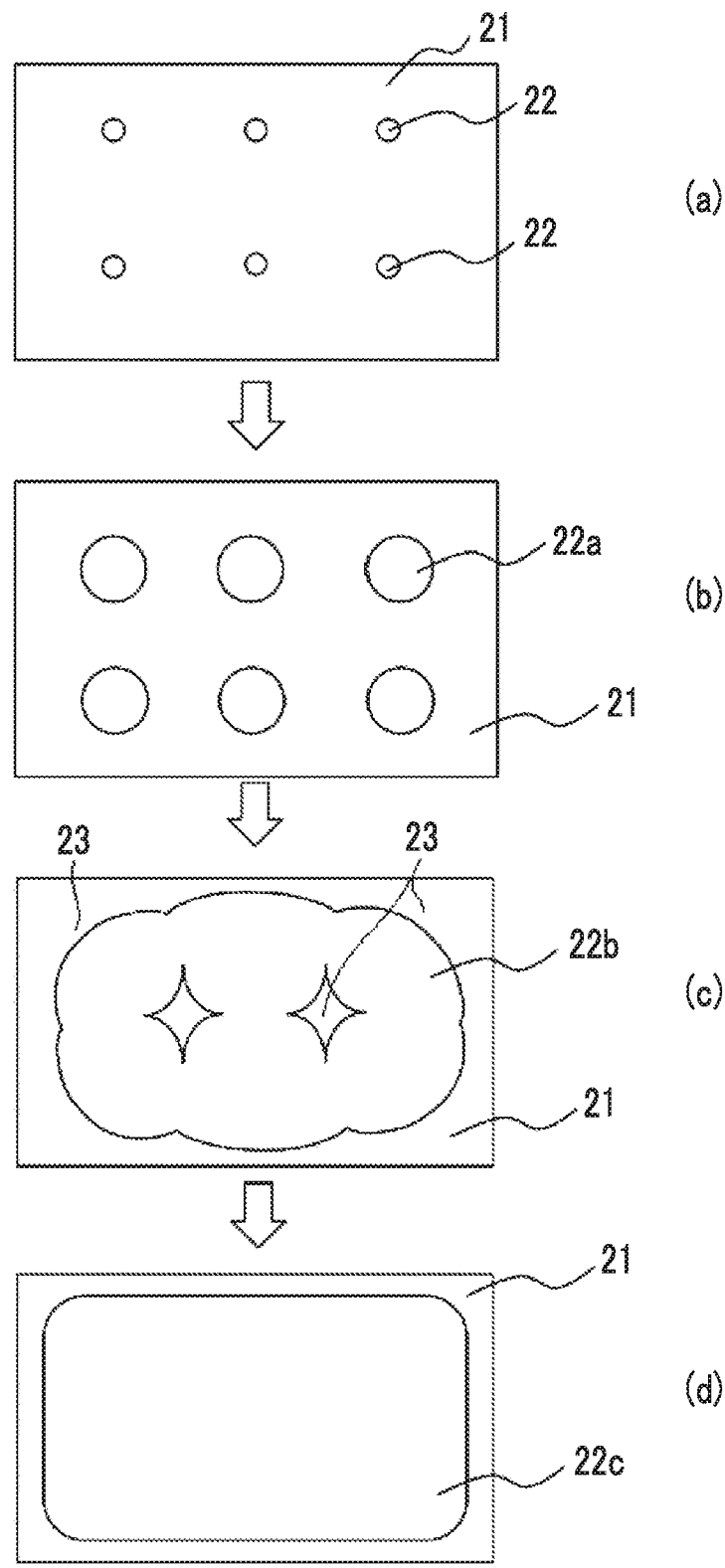

KIT, COMPOSITION FOR FORMING UNDERLAYER FILM FOR IMPRINTING, PATTERN FORMING METHOD, AND METHOD FOR MANUFACTURING SEMICONDUCTOR DEVICE

CROSS-REFERENCE TO RELATED APPLICATIONS

This application is a Continuation of PCT International Application No. PCT/JP2019/004931 filed on Feb. 13, 2019, which claims priority under 35 U.S.C § 119(a) to Japanese Patent Application No. 2018-023834 filed on Feb. 14, 2018. Each of the above application(s) is hereby expressly incorporated by reference, in its entirety, into the present application.

BACKGROUND OF THE INVENTION

1. Field of the Invention

The present invention relates to a kit, a composition for forming an underlayer film for imprinting, a pattern forming method, and a method for manufacturing a semiconductor device.

2. Description of the Related Art

An imprint method is a method in which a fine pattern is transferred by pressing a mold against a curable composition, curing the composition, and then peeling off the mold. An application of this method to a field of precision processing such as fabrication of a semiconductor integrated circuit is in progress. By the imprint method, an expensive fine processing device such as a stepper and an electron beam is not required, and thus a device structure is simple and a production cost is significantly reduced. Since the production cost is reduced, a process is simple, and high resolution and high throughput can be realized, an investigation for mass production of a device in various fields is being vigorously pursued.

In the imprint method, there is a technique in which a photosensitive resin composition is used as a material applied for patterning and processing is performed by combining a light-transmitting mold. In this production method, a pattern is formed on a cured film of the photosensitive resin composition disposed on a substrate by radiating light through a mold, and is used as an insulating member or as a mask for further processing. A method using ultraviolet rays (UV: Ultraviolet) as the light to be radiated is particularly called a UV nanoimprint method in some cases. In a photo-nanoimprint method including the UV nanoimprint method, unlike a thermal nanoimprint method in which a thermosetting resin composition is used and heating is required, processing at room temperature is possible. Therefore, the method can be widely used as a technique for realizing high quality in manufacture of a semiconductor device or the like in which heat is to be avoided.

In a nanoimprint lithography process, a technique for providing a pretreatment coating on a substrate to which a resist is applied has been proposed. JP2017-055108A discloses a method for forming a pretreatment coating on a substrate by using a pretreatment composition containing a polymerizable component, and disposing a discontinuous portion of an imprint resist thereon. In the method, a composite polymerizable coating containing a mixture of the pretreatment composition and the imprint resist is formed on the substrate, and the resultant is brought into contact with and polymerized with a template to obtain a composite polymerized layer on the substrate. Thereby, it is considered that throughput in the nanoimprint lithography process can be promoted.

In addition, a technique for forming an underlayer film on a substrate to which a curable composition for imprinting is applied has also been studied. For example, JP2013-093552A discloses an underlayer film composition for imprinting which contains a compound (A) and a solvent (B) and in which the compound (A) has a specific functional group and an Ohnishi parameter (Z) and a molecular weight are within a predetermined range. Specifically, an underlayer film composition in which an acrylic polymer and an acrylic monomer are combined is disclosed. An acrylic monomer is also used in a curable composition combined therewith. Thereby, it is considered that a pattern having excellent pattern formability and line edge roughness can be provided.

SUMMARY OF THE INVENTION

Here, in recent years, a demand for improving wettability of a curable composition for imprinting with respect to an underlayer film formed of a composition for forming an underlayer film for imprinting has been increasing. Moreover, adhesiveness between the underlayer film formed of the composition for forming an underlayer film for imprinting and a cured product formed of the curable composition for imprinting is also a problem.

The present invention aims to solve such a problem, and an object thereof is to provide a kit including both compositions which provides the wettability of the curable composition for imprinting with respect to the underlayer film and excellent adhesiveness between the underlayer film and the cured product formed of the curable composition for imprinting; a composition for forming an underlayer film for imprinting; a pattern forming method; and a method for manufacturing a semiconductor device.

Under the above object, the present inventors studied formulation of the composition for forming an underlayer film for imprinting, and investigated and analyzed an influence of various components on physical properties or performances. As a result, it was concluded that clarifying a chemical relationship with a component of the curable composition for imprinting in addition to design of the formulation of the composition for forming an underlayer film for imprinting, and adding the chemical relationship to the formulation design are important. In particular, a compound to be combined with a polymer having a polymerizable functional group, which is formulated in the composition for forming an underlayer film for imprinting, was accurately selected. Furthermore, the present inventors have found that the above object can be achieved by closely relating physical properties of a component of the composition for forming an underlayer film for imprinting to physical properties of a component of the curable composition for imprinting. Specifically, the above object has been achieved by the following units.

<1> A kit comprising: a curable composition for imprinting; and a composition for forming an underlayer film for imprinting, in which the composition for forming an underlayer film for imprinting contains a polymer having a polymerizable functional group, and a compound in which the lower one of a boiling point and a thermal decomposition temperature is 480° C. or higher and ΔHSP, which is a Hansen solubility parameter distance from a component with the highest content contained in the curable composition for imprinting, is 2.5 or less, and ΔHSP which is the Hansen solubility parameter distance is derived by Expression (1), $$\Delta HSP = [4.0 \times (\Delta D^2 + \Delta P^2 + \Delta H^2)]^{0.5}$$  Expression (1)

ΔD: a difference between a dispersion element component of a Hansen solubility parameter vector of the component with the highest content contained in the curable composition for imprinting and a dispersion element component of a Hansen solubility parameter vector of the compound contained in the composition for forming an underlayer film for imprinting, ΔP: a difference between a polarity element component of the Hansen solubility parameter vector of the component with the highest content contained in the curable composition for imprinting and a polarity element component of the Hansen solubility parameter vector of the compound contained in the composition for forming an underlayer film for imprinting, and ΔH: a difference between a hydrogen bond element component of the Hansen solubility parameter vector of the component with the highest content contained in the curable composition for imprinting and a hydrogen bond element component of the Hansen solubility parameter vector of the compound contained in the composition for forming an underlayer film for imprinting.

<2> The kit as described in <1>, in which the compound contained in the composition for forming an underlayer film for imprinting has a plurality of groups capable of polymerizing with the polymerizable functional group of the polymer in one molecule.

<3> The kit as described in <1> or <2>, in which at least one of the polymer or the compound contained in the composition for forming an underlayer film for imprinting has a polar functional group.

<4> The kit as described in <3>, in which the polar functional group has at least one kind selected from the group consisting of a sulfonyl group-containing group, a sulfonic acid group, a phosphoric acid group, and a hydroxyl group.

<5> The kit as described in any one of <1> to <4>, in which the polymerizable functional group of the polymer is a (meth)acryloyl group.

<6> The kit as described in any one of <1> to <5>, in which the polymer is an acrylic resin.

<7> The kit as described in any one of <1> to <6>, in which a weight-average molecular weight of the polymer is 4,000 or more.

<8> The kit as described in any one of <1> to <7>, in which a viscosity of the compound contained in the composition for forming an underlayer film for imprinting at 23° C. is 2,000 mPa·s or lower.

<9> The kit as described in any one of <1> to <8>, in which surface tension of the compound contained in the composition for forming an underlayer film for imprinting at 23° C. is 38 mN/m or higher.

<10> The kit as described in any one of <1> to <9>, in which the compound contained in the composition for forming an underlayer film for imprinting has three groups capable of polymerizing with the polymerizable functional group of the polymer in a molecule.

<11> The kit as described in any one of <1> to <10>, in which the group capable of polymerizing with the polymerizable functional group of the polymer is a (meth)acryloyl group.

<12> The kit as described in any one of <1> to <11>, in which an amount of the compound contained in the composition for forming an underlayer film for imprinting is 25 parts by mass to 400 parts by mass with respect to 100 parts by mass of the polymer.

<13> The kit as described in any one of <1> to <12>, in which the composition for forming an underlayer film for imprinting further contains at least one kind of a thermal polymerization initiator or a photopolymerization initiator.

<14> The kit as described in any one of <1> to <13>, in which the composition for forming an underlayer film for imprinting further contains a solvent, and the solvent accounts for 99.0% by mass or more of the composition for forming an underlayer film for imprinting.

<15> The kit as described in any one of <1> to <14>, in which a difference between a boiling point of a component with a largest formulation amount in the curable composition for imprinting and a boiling point of the compound contained in the composition for forming an underlayer film for imprinting is 150° C. or higher.

<16> The kit as described in any one of <1> to <15>, in which surface tension of the compound contained in the composition for forming an underlayer film for imprinting is higher than surface tension of a component with a largest formulation amount in the curable composition for imprinting.

<17> A composition for forming an underlayer film for imprinting, which is used in combination with a curable composition for imprinting, in which the composition for forming an underlayer film for imprinting contains a polymer having a polymerizable functional group, and a compound in which the lower one of a boiling point and a thermal decomposition temperature is 480° C. or higher and ΔHSP, which is a Hansen solubility parameter distance from a component with the highest content contained in the curable composition for imprinting, is 2.5 or less, and ΔHSP which is the Hansen solubility parameter distance is derived by Expression (1), $$\Delta HSP = [4.0 \times (\Delta D^2 + \Delta P^2 + \Delta H^2)]^{0.5}$$  Expression (1)

ΔD: a difference between a dispersion element component of a Hansen solubility parameter vector of the component with the highest content contained in the curable composition for imprinting and a dispersion element component of a Hansen solubility parameter vector of the compound contained in the composition for forming an underlayer film for imprinting, ΔP: a difference between a polarity element component of the Hansen solubility parameter vector of the component with the highest content contained in the curable composition for imprinting and a polarity element component of the Hansen solubility parameter vector of the compound contained in the composition for forming an underlayer film for imprinting, and ΔH: a difference between a hydrogen bond element component of the Hansen solubility parameter vector of the component with the highest content contained in the curable composition for imprinting and a hydrogen bond element component of the Hansen solubility parameter vector of the compound contained in the composition for forming an underlayer film for imprinting.

<18> The composition for forming an underlayer film for imprinting as described in <17>, in which the compound contained in the composition for forming an underlayer film for imprinting has a plurality of groups capable of polymerizing with the polymerizable functional group of the polymer in a molecule.

<19> A pattern forming method comprising: a step of applying a composition for forming an underlayer film for imprinting contained in the kit according to any one of <1> to <16> to a substrate to form an underlayer film for imprinting; a step of applying a curable composition for imprinting contained in the kit to the underlayer film for imprinting; a step of exposing the curable composition for imprinting in a state where a mold is brought into contact with the curable composition for imprinting; and a step of peeling off the mold.

<20> The pattern forming method as described in <19>, in which the step of forming the underlayer film for imprinting includes a spin coating method.

<21> The pattern forming method as described in <19> or <20>, in which the step of applying the curable composition for imprinting includes an ink jet method.

<22> A method for manufacturing a semiconductor device, comprising the pattern forming method as described in any one of <19> to <21>.

According to the present invention, it is possible to improve the wettability of the curable composition for imprinting with respect to the underlayer film formed of the composition for forming an underlayer film for imprinting. Moreover, it is possible to improve the adhesiveness between the underlayer film formed of the composition for forming an underlayer film for imprinting and a cured product (usually, a pattern) formed of the curable composition for imprinting. Furthermore, it is possible to provide a kit which includes the both compositions having the excellent performances; a composition for forming an underlayer film for imprinting; a pattern forming method; and a method for manufacturing a semiconductor device.

BRIEF DESCRIPTION OF THE DRAWINGS

FIGS. 1A to 1G are step explanatory diagrams showing an example of formation of a cured product pattern and a production process in a case where the obtained cured product pattern is used for processing of a substrate by etching.

FIG. 2 is a plan view schematically showing a state of wet spreading of a curable composition for imprinting in a case where the curable composition for imprinting is applied onto a surface of an underlayer film having low wettability by an ink jet method.

DESCRIPTION OF THE PREFERRED EMBODIMENTS

Hereinafter, contents of the present invention will be described in detail. Moreover, in the present specification, "to" is used to mean that the preceding and succeeding numerical values of "to" are included as a lower limit value and an upper limit value, respectively.

In the present specification, "(meth)acrylate" represents acrylate and methacrylate.

In the present specification, "imprint" preferably refers to transfer of a pattern with a size of 1 nm to 10 mm, and more preferably refers to transfer (nanoimprint) of a pattern with a size of about 10 nm to 100 µm.

In descriptions of a group (atomic group) in the present specification, in a case where the group is described without specifying whether the group is substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present specification, "light" includes not only light having a wavelength in an ultraviolet, near-ultraviolet, far-ultraviolet, visible, or infrared range, or an electromagnetic wave but also radiation. Examples of the radiation include a microwave, an electron beam, an extreme ultraviolet ray (EUV), and an X-ray. Moreover, laser light such as a 248-nm excimer laser, a 193-nm excimer laser, and a 172-nm excimer laser can also be used. The light may be monochromatic light (single-wavelength light) passing through an optical filter, or may be light (composite light) having a plurality of different wavelengths.

A weight-average molecular weight (Mw) in the present invention refers to a value measured by gel permeation chromatography (GPC) unless otherwise specified.

A temperature in the present invention is 23° C. unless otherwise specified.

A boiling point in the present invention refers to a boiling point at 1 atm (1 atm=1013.25 hPa).

A kit according to an embodiment of the present invention includes a curable composition for imprinting and a composition for forming an underlayer film for imprinting, in which the composition for forming an underlayer film for imprinting contains a polymer (hereinafter, referred to as a "specific polymer" in some cases) having a polymerizable functional group, and a compound (hereinafter, referred to as a "specific compound" in some cases) in which the lower one of a boiling point and a thermal decomposition temperature is 480° C. or higher and a Hansen solubility parameter distance (ΔHSP) (see Expression 1 described later) from a component with the highest content contained in the curable composition for imprinting is 2.5 or less. With such a configuration, the wettability of the curable composition for imprinting with respect to the underlayer film formed of the composition for forming an underlayer film for imprinting can be improved. Moreover, the adhesiveness between the underlayer film formed of the composition for forming an underlayer film for imprinting and a cured product formed of the curable composition for imprinting can be improved.

Although this mechanism is a presumption, by using a compound having a small Hansen solubility parameter distance from the curable composition for imprinting as a compound (specific compound) in which the lower one of a boiling point and a thermal decomposition temperature is 480° C. or higher, an affinity between the underlayer film and the curable composition for imprinting is improved and favorable wettability can be achieved. Moreover, by a compound in which the lower one of a boiling point and a thermal decomposition temperature is 480° C. or higher as the specific compound, even in a case where the composition for forming an underlayer film for imprinting which contains a polymer (specific polymer) having a polymerizable functional group is baked at a high temperature, the specific compound can be left in the underlayer film without being volatilized. Furthermore, the specific polymer forms a strong film having favorable interfacial adhesiveness to a base material, and adhesiveness to the cured product formed of the curable composition for imprinting can be ensured.

Hereinafter, the present invention will be described in detail.

<Hansen Solubility Parameter Distance (ΔHSP)>

In the kit according to an embodiment of the present invention, a Hansen solubility parameter distance (ΔHSP)

between the specific compound and a component (maximum amount component) with the highest content contained in the curable composition for imprinting is 2.5 or less, preferably 2.2 or less, more preferably 2.0 or less, and still more preferably 1.8 or less, and may be 1.5 or less. As the lower limit value, 0 is ideal but 1.0 or more is also a sufficiently practical level. By setting ΔHSP to 2.5 or less, the affinity with the curable composition for imprinting is improved and the wettability of the curable composition for imprinting on the underlayer film for imprinting is improved.

The Hansen solubility parameter distance (ΔHSP) is derived by Expression (1).

$$\Delta HSP=[4.0\times(\Delta D^2+\Delta P^2+\Delta H^2)]^{0.5} \quad \text{Expression (1)}$$

ΔD: a difference (d component 1–d component 2) between a dispersion element component (d component 1) of a Hansen solubility parameter vector of the component with the highest content contained in the curable composition for imprinting and a dispersion element component (d component 2) of a Hansen solubility parameter vector of the compound contained in the composition for forming an underlayer film for imprinting ΔP: a difference (p component 1–p component 2) between a polarity element component (p component 1) of the Hansen solubility parameter vector of the component with the highest content contained in the curable composition for imprinting and a polarity element component (p component 2) of the Hansen solubility parameter vector of the compound contained in the composition for forming an underlayer film for imprinting ΔH: a difference (h component 1–h component 2) between a hydrogen bond element component (h component 1) of the Hansen solubility parameter vector of the component with the highest content contained in the curable composition for imprinting and a hydrogen bond element component (h component 2) of the Hansen solubility parameter vector of the compound contained in the composition for forming an underlayer film for imprinting The dispersion element component, the polarity element component, and the hydrogen bond element component in the HSP vector are respectively set by methods described in Examples described later. In the present invention, the target components are the maximum amount component of the curable composition for imprinting and the specific compound in the composition for forming an underlayer film for imprinting, but in a case where there are a plurality of the specific compounds, a maximum amount component thereof is adopted for evaluation. Furthermore, in a case where formulation amounts of the corresponding components are the same, a calculated value for a compound having higher surface tension is adopted. The maximum amount component refers to a component having the maximum mass.

The specific compound plays a role in increasing the affinity with the curable composition for imprinting by approximating HSP thereof to HSP of the maximum amount component (preferably polymerizable compound) of the curable composition for imprinting as described above. Thereby, favorable wettability can be realized, and, in a preferred embodiment, favorable adhesiveness can also be achieved.

<Composition for Forming Underlayer Film for Imprinting>
<<Specific Polymer>>

The composition for forming an underlayer film for imprinting contains a polymer (specific polymer) having a polymerizable functional group. A kind of the specific polymer is not particularly limited as long as the polymer has a polymerizable functional group.

The specific polymer is usually a compound having a weight-average molecular weight of 2,000 or more, preferably 4,000 or more, more preferably 6,000 or more, and still more preferably 10,000 or more. The upper limit of the weight-average molecular weight is not particularly limited, but is, for example, preferably 200,000 or less, more preferably 70,000 or less, and still more preferably 50,000 or less. By setting the weight-average molecular weight to be equal to or more than the lower limit value, film stability during a baking treatment is improved and thus a surface condition at the time of forming the underlayer film for imprinting can be further improved. Moreover, by setting the weight-average molecular weight to be equal to or less than the upper limit value, a solubility in a solvent is increased and application by spin coating or the like becomes easier. In addition, the weight-average molecular weight (Mw) in the present invention refers to a value measured by gel permeation chromatography (GPC) unless otherwise specified. Furthermore, by setting the molecular weight to be within an appropriate range, fluidity is maintained and the wettability of the curable composition for imprinting is improved.

The specific polymer has a polymerizable functional group. Specific examples of the polymerizable functional group include a (meth)acryloyl group, an epoxy group, an oxetane group, a methylol group, a methylol ether group, and a vinyl ether group. From the viewpoint of easy polymerization, a (meth)acryloyl group is particularly preferable. In the present specification, the polymerizable functional groups defined and exemplified here are called a polymerizable functional group Ps. In a case where the polymer has a polymerizable functional group, the underlayer film for imprinting forms a crosslinked structure, and thus it is possible to prevent the underlayer film from being broken at the time of peeling-off and ensure the adhesiveness.

The specific polymer preferably has a polar functional group Tf in order to strengthen adhesiveness to a base material. Specific examples thereof include a hydroxyl group, a carboxyl group, an alkoxycarbonyl group (—CO-OR$^{Q1}$), an amino group (—NR$^N_2$), an amide group (—CONR$^N_2$), an imide group-containing group (—CONR$^N$-COR$^{Q1}$), a urea group-containing group (—NR$^N$CONR$^N_2$), a urethane group (—OCONR$^N_2$, —NR$^N$COOR$^{Q2}$), a cyano group, an oxygen atom (ether group), an (oligo)alkyleneoxy group having a preferred range defined in the following linking group L, a cyclic ether group (the number of the carbon atoms is preferably 2 to 12, more preferably 2 to 6, and still more preferably 2 or 3), a lactone group (the number of the carbon atoms is preferably 2 to 12, more preferably 2 to 6, and still more preferably 2 to 4), a sulfonyl group-containing group (—SO$_2$R$^{Q3}$), a sulfonic acid group (—SO$_2$(OH)), a sulfinic acid group (—SO$_2$H)), a sulfonamide group (—SO$_2$NR$^N_2$), a sulfonimidoyl group-containing group (—S(O)(NR$^N$)R$^{Q1}$), a phosphoric acid group (—O(P=O)(OH)$_2$), and a phosphate group (—O(P=O)(OH)(OR$^{Q1}$), —O(P=O)(OR$^{Q1}$)$_2$). Among them, in particular, a sulfonyl group-containing group, a sulfonic acid group, a sulfinic acid group, a sulfonamide group, a sulfonimidoyl group-containing group, a phosphoric acid group, a phosphate group, a cyano group, a carboxyl group, an amino group, and a hydroxyl group are preferable, and a sulfonyl group-containing group, a sulfonic acid group, a phosphoric acid group, and a hydroxyl group are more preferable. The definition of $R^N$ is as described later.

$R^{Q1}$ is each independently an alkyl group (the number of the carbon atoms is preferably 1 to 24, more preferably 1 to 12, and still more preferably 1 to 6), an arylalkyl group (the number of the carbon atoms is preferably 7 to 21, more preferably 7 to 15, and still more preferably 7 to 11), an alkenyl group (the number of the carbon atoms is preferably 2 to 24, more preferably 2 to 12, and still more preferably 2 to 6), and an alkynyl group (the number of the carbon atoms is preferably 2 to 12, more preferably 2 to 6, and still more preferably 2 or 3), an aryl group (the number of the carbon atoms is preferably 6 to 22, more preferably 6 to 18, and still more preferably 6 to 10).

$R^{Q2}$ is a hydrogen atom or the substituent defined for $R^{Q1}$.

$R^{Q3}$ is a substituent of $R^{Q1}$ or $OR^{Q1}$.

$R^{Q1}$ to $R^{Q3}$ may have a substituent T as long as the effects of the present invention are exhibited. For example, a hydroxyl group, an amino group, a carboxyl group, and the like may be substituted.

In a case where the specific polymer has the polar functional group Tf, adhesiveness to a base material interface tends to be improved.

In the present invention, it is preferable that at least one of the specific polymer or the specific compound has the polar functional group Tf and more preferable that the specific polymer has a compound having the polar functional group Tf. Needless to say, both the specific polymer and the specific compound may have the polar functional group Tf.

In addition, an aspect in which a compound other than the specific polymer and the specific compound has the polar functional group Tf is also included in the scope of the present invention.

One example of an embodiment of the specific polymer is a polymer containing a constitutional unit including a polymerizable functional group. In the present embodiment, the total of constitutional units including a polymerizable functional group preferably accounts for 90% by mole or more of all the constitutional units. Only one kind of the constitutional unit including a polymerizable functional group may be contained, or two or more kinds thereof may be contained. In a case where two or more kinds thereof are contained, the total amount is preferably within the above range. In the present embodiment, an aspect in which the constitutional unit including a polymerizable functional group includes the polar functional group Tf is also preferable.

Another example of the embodiment of the specific polymer is a polymer containing a constitutional unit including a polymerizable functional group and a constitutional unit including the polar functional group. In the present embodiment, the total of the constitutional unit including a polymerizable functional group and the constitutional unit including the polar functional group preferably accounts for 90% by mole or more of all the constitutional units. Moreover, a molar ratio of the constitutional unit including a polymerizable functional group to the constitutional unit including the polar functional group is preferably 10 to 95:90 to 5, more preferably 30 to 93:7 to 70, and still more preferably 40 to 90:10 to 60. One kind of each of the constitutional unit including a polymerizable functional group and the constitutional unit including the polar functional group may be contained, or two or more kinds thereof may be contained. In a case where two or more kinds thereof are contained, the total amount is preferably within the above range.

Examples of the specific polymer include an acrylic resin, a novolac resin, an epoxy resin, a polyurethane resin, a phenol resin, a polyester resin, and a melamine resin, an acrylic resin and a novolac resin are preferable, and an acrylic resin is more preferable. Furthermore, it goes without saying that the acrylic resin includes not only a polymer of an acrylate monomer but also a polymer of a methacrylate monomer.

In particular, the specific polymer is preferably represented by Formula (1) or (2).

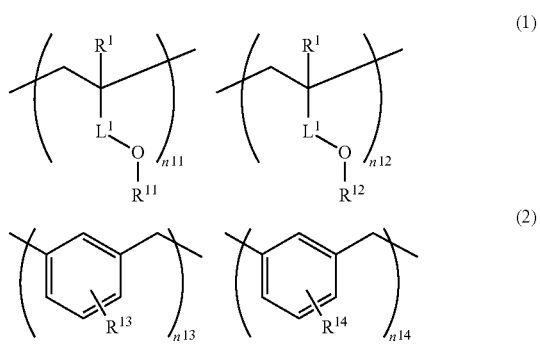

$R^1$ is a hydrogen atom or a methyl group. $L^1$ is a single bond or a divalent linking group. Examples of the linking group include examples of the following linking group L, and examples of the following linking group Lh are preferable. Among them, a single bond, an oxygen atom, a carbonyl group, $-NR^N-$, an arylene group (the number of the carbon atoms is preferably 6 to 22, more preferably 6 to 18, and still more preferably 6 to 10), or a combination thereof is preferable, and an oxygen atom, a carbonyl group, a combination thereof, or a phenylene group is more preferable.

n11 and n12 are numbers such that the sum thereof is 100 or less, and are copolymerization ratios based on a molar ratio of each constitutional unit. n11 is preferably 10 to 95, more preferably 20 to 90, and still more preferably 30 to 80. n12 is preferably 5 to 90 and more preferably 10 to 80. In a case where the sum of n11 and n12 is 100 or less, it means that other constitutional units are copolymerized therewith to become 100.

n13 and n14 are numbers such that the sum thereof is 100 or less, and are copolymerization ratios based on a molar ratio of each constitutional unit. n13 is preferably 10 to 95, more preferably 20 to 90, and still more preferably 30 to 80. n14 is preferably 5 to 95, more preferably 10 to 80, and still more preferably 20 to 70. In a case where the sum of n13 and n14 is 100 or less, it means that other constitutional units are copolymerized therewith to become 100.

$R^{11}$ is a substituent having a polymerizable functional group, and is preferably a substituent represented by Formula (T1).

$L^2$ is a (t1+1)-valent linking group, and is preferably a group having a cyclic, linear, or branched alkane structure (the number of the carbon atoms is preferably 1 to 40, more preferably 1 to 30, and still more preferably 1 to 20), a group having a cyclic, linear, or branched alkene structure (the number of the carbon atoms is preferably 2 to 40, more preferably 2 to 30, and still more preferably 2 to 20), a group having a cyclic, linear, or branched alkyne structure (the number of the carbon atoms is preferably 2 to 40, more preferably 2 to 30, and still more preferably 2 to 20), a group having an aryl structure (the number of the carbon atoms is preferably 6 to 22, more preferably 6 to 18, and still more preferably 6 to 10), or a group having a heteroaryl structure (the number of the carbon atoms is preferably 1 to 22, more preferably 1 to 18, and still more preferably 1 to 10). Preferred examples of a ring structure of the group having an aryl structure include examples of the following hydrocarbon aromatic ring aCy. Preferred examples of a ring structure of the group having a heteroaryl structure include examples of the following aromatic heterocycle hCy. Preferred examples of ring structures of the group having an alkane structure, the group having an alkene structure, and the group having an alkyne structure, which are cyclic, include examples of the following alicycle fCy. $L^2$ may have the substituent T as long as the effects of the present invention are exhibited. A ring may be formed by bonding the substituents T to each other in a case where a plurality of the substituents T are present, or by bonding the substituent T to $L^2$ in the formula via or without via the linking group L.

t2 is 0 or 1.

$L^3$ is a linking group (preferably, the linking group L described later), and among them, an acyclic linking group is preferable and an alkylene group, an alkenylene group, an alkyleneoxy group, an oxygen atom, a carbonyl group, or a group related to a combination thereof is more preferable. $L^3$ may have the substituent T as long as the effects of the present invention are exhibited. For example, an aspect in which a hydroxyl group is substituted for the alkyleneoxy group or an alkylene chain of the alkyleneoxy group can be mentioned as a preferred example. A ring may be formed by bonding the substituents T to each other in a case where a plurality of the substituents T are present, or by bonding the substituent T to $L^3$ in the formula via or without via the linking group L.

t3 is 0 or 1.

P is a polymerizable functional group, and is preferably the polymerizable functional group Ps. In the present invention, among them, it is preferable that a (meth)acryloyl group is applied.

t1 is preferably 1 to 6, more preferably 1 to 3, still more preferably 1 or 2, and even more preferably 1.

t4 is preferably 1 to 4, more preferably 1 to 3, still more preferably 1 or 2, and even more preferably 1. In a case where t4 is 2 or more, $L^3$ can be a tri- or higher valent linking group. For example, the alkylene group can be an alkanetriyl group or an alkanetetrayl group.

$R^{12}$ is a substituent having no polymerizable functional group, and is preferably a substituent represented by Formula (T2).

$$-(L^3)_{t3}-[(L^2)_{t2}-(Q)_{t1}]_{t4} \quad (T2)$$

$L^2$, $L^3$, t1, t2, t3, and t4 are the same as $L^2$, $L^3$, t1, t2, t3, and t4 in Formula (T1), and preferred ranges thereof are also the same.

Q is a hydrogen atom or the polar functional group Tf, and is preferably the polar functional group Tf.

$R^{13}$ is represented by Formula (T3).

$$-(L^4)-T^1 \quad (T3)$$

$L^4$ is a single bond or a linking group Lh having a heteroatom, and among them, an oxygen atom, a carbonyl group, $-NR^N-$, or a combination thereof is preferable, an oxygen atom, a carbonyl group, or a combination thereof is more preferable, and an oxygen atom is still more preferable. $T^1$ is a substituent represented by Formula (T1).

$R^{14}$ is represented by Formula (T4).

$$-(L^4)-T^2 \quad (T4)$$

$L^4$ has the same definition as $L^4$ in Formula (T3). $T^2$ is preferably a substituent represented by Formula (T2).

A benzene ring included in a main chain of the constitutional unit in Formula (2) may have the substituent T as long as the effects of the present invention are exhibited. In a case where there are the plurality of substituents T, the plurality of substituents T may be the same as or different from each other. For example, an example in which a hydroxyl group or an alkoxyl group is included is also mentioned as a preferred aspect.

Formulae (1) and (2) may further include a constitutional unit (this is referred to as the other constitutional unit in some cases) which is not described in the formulae. A copolymerization ratio of the other constitutional unit may be adjusted within the range in which the effects of the present invention are exhibited, and for example, is preferably 0.5 to 50 and more preferably 1 to 30, in terms of a molar ratio.

Specific examples of the hydrocarbon aromatic ring aCy include a benzene ring, a naphthalene ring, an anthracene ring, a phenanthrene ring, a phenalene ring, a fluorene ring, an acenaphthylene ring, a biphenyl ring, a terphenyl ring, an indene ring, an indane ring, a triphenylene ring, a tetraphenylene ring, a pyrene ring, a chrysene ring, a perylene ring, and a tetrahydronaphthalene ring. The aromatic ring may have a structure in which a plurality of rings are linked to each other via or without via the linking group L, and examples thereof include a biphenyl ring, a diphenylmethane ring, and a triphenylmethane ring. Alternatively, examples of the structure in which a plurality of benzene rings are linked to each other, including some exemplified rings, include structures represented by Formulae Ar1 to Ar5. $A^1$ is a divalent linking group, examples of the linking group L are preferable, and an alkylene group (the number of the carbon atoms is preferably 1 to 12, more preferably 1 to 6, and still more preferably 1 to 3) which may be substituted with a fluorine atom, a carbonyl group, an oxygen atom, a sulfonyl group, a sulfinyl group, and $-NR^N-$ are more preferable. $A^2$ represents a nitrogen atom, a trivalent linking group containing a phosphorus atom, or a methine group. In Formulae Ar1 to Ar5, a bond is not shown, but this means that bonding may be performed at a necessary moiety according to a necessary number of linkages. For example, in a case of a methine group, the methine group may be substituted at the moiety. Alternatively, for example, an aspect in which two bonds are extended from one benzene ring can also be mentioned as the preferred aspect of the present invention. Moreover, an aspect in which Ar2 having three rings is a divalent linking group can also be mentioned as the preferred aspect of the present invention. Furthermore, Ar1 to Ar5 may further have the substituent T. A bond may be positioned at the substituent T to be linked.

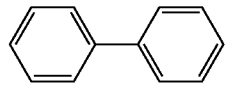

Ar1

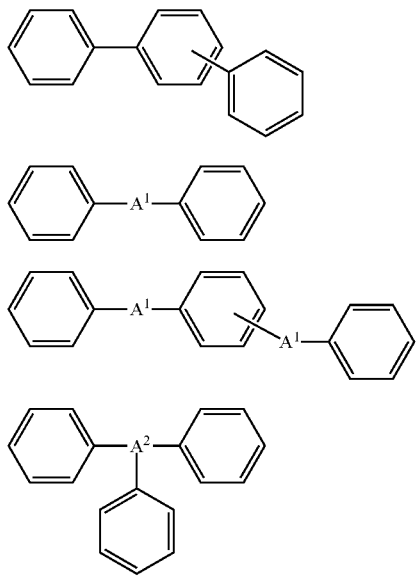

Ar2

Ar3

Ar4

Ar5

Specific examples of the aromatic heterocycle hCy include a thiophene ring, a furan ring, a pyrrole ring, an imidazole ring, a pyrazole ring, a triazole ring, a tetrazole ring, a thiazole ring, an oxazole ring, a pyridine ring, a pyrazine ring, a pyrimidine ring, a pyridazine ring, a triazine ring, an isoindole ring, an indole ring, an indazole ring, a purine ring, a quinolizine ring, an isoquinoline ring, a quinoline ring, a phthalazine ring, a naphthyridine ring, a quinoxaline ring, a quinazoline ring, a cinnoline ring, a carbazole ring, an acridine ring, a phenazine ring, a phenothiazine ring, and a phenoxazine ring. The aromatic heterocycle may have a structure in which a plurality of ring structures are linked to each other via or without via the linking group L.

Specific examples of the alicycle fCy include a cyclopropane ring, a cyclobutane ring, a cyclobutene ring, a cyclopentane ring, a cyclohexane ring, a cyclohexene ring, a cycloheptane ring, a cyclooctane ring, a dicyclopentadiene ring, a tetrahydrodicyclopentadiene ring, an octahydronaphthalene ring, a decahydronaphthalene ring, a hexahydroindane ring, a bornane ring, a norbornane ring, a norbornene ring, an isobornane ring, a biciclononane ring, a tricyclodecane ring, a tetracyclododecane ring, an adamantane ring, an oxane ring, a dioxane ring, a dioxolane ring, an oxirane ring, an oxolane ring, a morpholine ring, a piperazine ring, a piperidine ring, a pyrrolidine ring, and a pyrrolidone ring. The alicycle may have a structure in which a plurality of ring structures are linked to each other via or without via the linking group L.

Examples of the linking group Lh containing a heteroatom include an oxygen atom, a sulfur atom, a carbonyl group, a thiocarbonyl group, a sulfonyl group, a sulfinyl group, $-NR^N-$, an (oligo)alkyleneoxy group (the number of carbon atoms in an alkylene group in one constitutional unit is preferably 1 to 12, more preferably 1 to 6, and still more preferably 1 to 3; and the number of repetitions is preferably 1 to 50, more preferably 1 to 40, and still more preferably 1 to 30), or a linking group consisting of a combination thereof. The number of atoms, excluding a hydrogen atom, constituting the linking group Lh containing a heteroatom is preferably 1 to 100, more preferably 1 to 70, and particularly preferably 1 to 50. The number of linking atoms of Lh is preferably 1 to 25, more preferably 1 to 20, still more preferably 1 to 15, and even more preferably 1 to 10. Furthermore, the (oligo)alkyleneoxy group means that the group may be an alkyleneoxy group or an oligoalkyleneoxy group. The (oligo)alkyleneoxy group or the like may be chain-like or cyclic, or may be linear or branched.

Examples of the substituent T include an alkyl group (the number of the carbon atoms is preferably 1 to 24, more preferably 1 to 12, and still more preferably 1 to 6), an arylalkyl group (the number of the carbon atoms is preferably 7 to 21, more preferably 7 to 15, and still more preferably 7 to 11), an alkenyl group (the number of the carbon atoms is preferably 2 to 24, more preferably 2 to 12, and still more preferably 2 to 6), an alkynyl group (the number of the carbon atoms is preferably 2 to 12, more preferably 2 to 6, and still more preferably 2 or 3), a hydroxyl group, an amino group (the number of the carbon atoms is preferably 0 to 24, more preferably 0 to 12, and still more preferably 0 to 6), a thiol group, a carboxyl group, an aryl group (the number of the carbon atoms is preferably 6 to 22, more preferably 6 to 18, and still more preferably 6 to 10), a heteroaryl group (the number of the carbon atoms is preferably 1 to 22, more preferably 1 to 16, and still more preferably 1 to 12), an alkoxyl group (the number of the carbon atoms is preferably 1 to 12, more preferably 1 to 6, and still more preferably 1 to 3), an aryloxy group (the number of the carbon atoms is preferably 6 to 22, more preferably 6 to 18, and still more preferably 6 to 10), an acyl group (the number of the carbon atoms is preferably 2 to 12, more preferably 2 to 6, and still more preferably 2 or 3), an acyloxy group (the number of the carbon atoms is preferably 2 to 12, more preferably 2 to 6, and still more preferably 2 or 3), an aryloyl group (the number of the carbon atoms is preferably 7 to 23, more preferably 7 to 19, and still more preferably 7 to 11), an aryloyloxy group (the number of the carbon atoms is preferably 7 to 23, more preferably 7 to 19, and still more preferably 7 to 11), a carbamoyl group (the number of the carbon atoms is preferably 1 to 12, more preferably 1 to 6, and still more preferably 1 to 3), a sulfamoyl group (the number of the carbon atoms is preferably 0 to 12, more preferably 0 to 6, and still more preferably 0 to 3), a sulfo group, an alkylsulfonyl group (the number of the carbon atoms is preferably 1 to 12, more preferably 1 to 6, and still more preferably 1 to 3), an arylsulfonyl group (the number of the carbon atoms is preferably 6 to 22, more preferably 6 to 18, and still more preferably 6 to 10), a heterocyclic group (the number of the carbon atoms is preferably 1 to 12, more preferably 1 to 8, and still more preferably 2 to 5, and a 5-membered ring or a 6-membered ring is preferably contained), a (meth)acryloyl group, a (meth)acryloyloxy group, a halogen atom (for example, a fluorine atom, a chlorine atom, a bromine atom, and an iodine atom), an oxo group ($=O$), an imino group ($=NR^N$), and an alkylidene group ($=C(R^N)_2$).

$R^N$ is a hydrogen atom, an alkyl group (the number of the carbon atoms is preferably 1 to 12, more preferably 1 to 6, and still more preferably 1 to 3), an alkenyl group (the number of the carbon atoms is preferably 2 to 12, more preferably 2 to 6, and still more preferably 2 or 3), an alkynyl group (the number of the carbon atoms is preferably 2 to 12, more preferably 2 to 6, and still more preferably 2 or 3), an aryl group (the number of the carbon atoms is preferably 6 to 22, more preferably 6 to 18, and still more preferably 6 to 10), or a heteroaryl group (the number of the carbon atoms is preferably 1 to 22, more preferably 1 to 16, and still more preferably 1 to 12), and among them, a hydrogen atom, a methyl group, an ethyl group, or a propyl group is preferable. $R^N$ may further have each group defined for the substituent T as long as the effects of the present invention are exhibited.

An alkyl moiety, an alkenyl moiety, and an alkynyl moiety contained in each substituent may be chain-like or cyclic, or may be linear or branched. In a case where the substituent T is a group capable of taking a substituent, the substituent T may further have a substituent T. For example, the alkyl group may become a halogenated alkyl group, or may become a (meth)acryloyloxyalkyl group, an aminoalkyl group, or a carboxyalkyl group.

Examples of the linking group L include an alkylene group (the number of the carbon atoms is preferably 1 to 24, more preferably 1 to 12, and still more preferably 1 to 6), an alkenylene group (the number of the carbon atoms is preferably 2 to 12, more preferably 2 to 6, and still more preferably 2 or 3), an alkynylene group (the number of the carbon atoms is preferably 2 to 12, more preferably 2 to 6, and still more preferably 2 or 3), an (oligo)alkyleneoxy group (the number of carbon atoms in an alkylene group in one constitutional unit is preferably 1 to 12, more preferably 1 to 6, and still more preferably 1 to 3; and the number of repetitions is preferably 1 to 50, more preferably 1 to 40, and still more preferably 1 to 30), an arylene group (the number of the carbon atoms is preferably 6 to 22, more preferably 6 to 18, and still more preferably 6 to 10), an oxygen atom, a sulfur atom, a sulfonyl group, a carbonyl group, a thiocarbonyl group, —$NR^N$—, and a linking group related to a combination thereof. The alkylene group may have the following substituent T. For example, the alkylene group may have a hydroxyl group. The number of atoms, excluding a hydrogen atom, contained in the linking group L is preferably 1 to 50, more preferably 1 to 40, and still more preferably 1 to 30. The number of linking atoms means the number of atoms positioned on the shortest path among the atomic groups involved in the linkage. For example, in a case of —$CH_2$—(C=O)—O—, the number of atoms involved in the linkage is 6, and is 4 even excluding a hydrogen atom. On the other hand, the shortest atom involved in the linkage is —C—C—O—, and thus the number of atoms is 3. The number of the linking atoms is preferably 1 to 24, more preferably 1 to 12, and still more preferably 1 to 6. Furthermore, the alkylene group, the alkenylene group, the alkynylene group, and the (oligo)alkyleneoxy group may be chain-like or cyclic, or may be linear or branched.

A content ratio of the specific polymer in the composition for forming an underlayer film for imprinting is preferably 0.01% by mass or more, more preferably 0.05% by mass or more, and still more preferably 0.1% by mass or more. The upper limit is preferably 10% by mass or less, more preferably 7% by mass or less, still more preferably 5% by mass or less, even more preferably 4% by mass or less, and further still more preferably 3% by mass or less, and may be 1% by mass or less or 0.7% by mass or less.

The content ratio of the specific polymer in a non-volatile component (refers to components other than a solvent in the composition, hereinafter, the same applies) is preferably 5% by mass or more, more preferably 20% by mass or more, and still more preferably 30% by mass or more. The upper limit is preferably 90% by mass or less, more preferably 70% by mass or less, and still more preferably 60% by mass or less.

By setting the amount to be equal to or more than the lower limit value, the effect caused by formulation of the polymer can be suitably exhibited, and a uniform thin film can be easily prepared. On the other hand, by setting the amount to be equal to or less than the upper limit value, the effect of using a solvent is suitably exhibited, and a uniform film can be easily formed over a wide area.

Only one kind of the specific polymer may be used, or two or more kinds thereof may be used. In a case where two or more kinds thereof are used, the total amount is preferably within the above range.

Examples of the specific polymer include polymers used in the following Examples, but the present invention is not construed as being limited thereto.

<<Specific Compound>>

The specific compound contained in the composition for forming an underlayer film for imprinting used in the present invention is a compound in which the lower one of a boiling point and a thermal decomposition temperature is 480° C. or higher and a Hansen solubility parameter distance (ΔHSP) from a component with the highest content contained in the curable composition for imprinting is 2.5 or less. The specific compound preferably has a boiling point of 480° C. or higher.

The boiling point (bp1) of the specific compound is required to be 480° C. or higher, is more preferably 500° C. or higher, and is still more preferably 550° C. or higher. The upper limit is not particularly limited, but is preferably 800° C. or lower, for example. In a case where the boiling point is lower than the lower limit value, the specific compound having a low molecular weight is volatilized during baking after coating, and thus outgassing may occur.

A difference (bp1−bp2) between the boiling point (bp1) of the specific compound contained in the composition for forming an underlayer film for imprinting and a boiling point (bp2) of a component with a largest formulation amount in the curable composition for imprinting, which will be described later, is preferably 80° C. or higher, more preferably 100° C. or higher, still more preferably 150° C. or higher, and even more preferably 170° C. or higher. The upper limit of the difference between the boiling points can be, for example, 300° C. or lower.

In addition, in a case where two or more kinds of the specific compounds of the composition for forming an underlayer film for imprinting are adopted, a compound having the lowest boiling point is targeted for the comparison of the boiling points.

The specific compound is preferably a compound having a molecular weight lower than that of the specific polymer. Specifically, the molecular weight is preferably less than 2,000, more preferably 1,500 or less, still more preferably 1,300 or less, and even more preferably 1,000 or less. The lower limit value is practically 100 or more.

The specific compound preferably has a group (hereinafter, simply referred to as a "polymerizable group" in some cases) capable of polymerizing with a polymerizable functional group of the specific polymer in a molecule. The number of polymerizable groups in one molecule of the specific compound is preferably 2 or more and more preferably 3 or more. Moreover, the upper limit is preferably 6 or less, and may be 5 or less or 4 or less. It is particularly preferable that the number of polymerizable groups of the specific compound is 3 in one molecule. In the preferred embodiment of the present invention, by having a plurality of polymerizable groups, the specific compound having a lower molecular weight functions as a crosslinking agent for forming three-dimensionally crosslinking between main chains of the specific polymer having a higher molecular weight, and close adhesion becomes stronger. However, the present invention is not construed as being limited thereto.

The polymerizable group is not particularly limited as long as the group is capable of polymerizing with the polymerizable functional group of the specific polymer, examples thereof include a (meth)acryloyl group, an epoxy group, a vinyl group, and a vinyl ether group, a group corresponding to the polymerizable functional group Ps is preferable, an epoxy group and a (meth)acryloyl group are more preferable, and a (meth)acryloyl group is still more preferable.

In addition, it is preferable that at least one kind of the polymerizable group contained in the specific compound is common to at least one kind of the polymerizable functional group of the specific polymer.

The specific compound may have the polar functional group Tf in order to strengthen adhesiveness to a base material. Specific examples thereof include a hydroxyl group, a carboxyl group, an alkoxycarbonyl group (—CO—OR$^{Q1}$), an amino group (—NR$^N{}_2$), an amide group (—CONR$^N{}_2$), an imide group-containing group (—CONR$^N$—COR$^{Q1}$), a urea group-containing group (—NR$^N$CONR$^N{}_2$), a urethane group (—OCONR$^N{}_2$, —NR$^N$COOR$^{Q2}$), a cyano group, an oxygen atom (ether group), an (oligo)alkyleneoxy group having a preferred range defined in the following linking group L, a cyclic ether group (the number of the carbon atoms is preferably 2 to 12, more preferably 2 to 6, and still more preferably 2 or 3), a lactone group (the number of the carbon atoms is preferably 2 to 12, more preferably 2 to 6, and still more preferably 2 to 4), a sulfonyl group-containing group (—SO$_2$R$^{Q3}$), a sulfonic acid group (—SO$_2$(OH)), a sulfinic acid group (—SO$_2$H)), a sulfonamide group (—SO$_2$NR$^N{}_2$), a sulfonimidoyl group-containing group (—S(O)(NR$^N$)R$^{Q1}$), a phosphoric acid group (—O(P=O)(OH)$_2$), and a phosphate group (—O(P=O)(OH)(OR$^{Q1}$), —O(P=O)(OR$^{Q1}$)$_2$). Among them, in particular, a sulfonyl group-containing group, a sulfonic acid group, a sulfinic acid group, a sulfonamide group, a sulfonimidoyl group-containing group, a phosphoric acid group, a phosphate group, a cyano group, a carboxyl group, an amino group, and a hydroxyl group are preferable.

In a Hansen solubility parameter (HSP) vector of the specific compound,
  (i) a dispersion element component (d component) is preferably 14.0 to 20.0, more preferably 15.0 to 20.0, still more preferably 17.0 to 19.0, even more preferably 17.5 to 19.0, and further still more preferably 18.0 to 19.0,
  (ii) a polarity element component (p component) is preferably 3.5 to 8.0, more preferably 4.0 to 8.0, still more preferably 4.0 to 7.5, and even more preferably 4.0 to 5.5, and
  (iii) a hydrogen bond element component (h component) is preferably 4.0 to 8.0, more preferably 4.0 to 7.5, and still more preferably 4.5 to 5.5.

The dispersion element component, the polarity element component, and the hydrogen bond element component in the HSP vector of the specific compound are respectively set by methods described in Examples described later.

Furthermore, without being limited to the specific compound, in a case where there are a plurality of non-volatile components, it is preferable that at least one kind of component other than the specific compound also satisfies the above range, more preferable that 80% by mass or more of non-volatile components other than the specific compound satisfy the above range, and still more preferable that all components satisfy the above range.

A viscosity of the specific compound at 23° C. is preferably 2,000 mPa·s or lower and more preferably 1,000 mPa·s or lower. Moreover, 3 mPa·s or higher is preferable, 10 mPa·s or higher is more preferable, and 50 mPa·s or higher is still more preferable. In a case where the viscosity is higher than the upper limit value, fluidity of the specific compound having a low molecular weight at the time of crosslinking by baking is degraded, crosslinking becomes difficult to form, and thus adhesiveness may be degraded. Moreover, in a case where the viscosity is lower than the lower limit value, film stability during baking is degraded and thus a surface condition of the underlayer film for imprinting may deteriorate. Furthermore, as the viscosity of the specific compound, a value measured based on a method described in Example described later is adopted.

Surface tension of the specific compound is preferably 35 mN/m or higher, more preferably 38 mN/m or higher, and still more preferably 40 mN/m or higher. The upper limit is not particularly limited, but is preferably 45 mN/m or lower, for example. In a case where the surface tension is lower than the lower limit value, surface energy of an underlayer film for imprinting formed after baking is decreased and thus wettability of a curable composition for imprinting may deteriorate. As the viscosity of the specific compound, a value measured based on a method described in Example described later is adopted.

The specific compound is preferably represented by Formula (3).

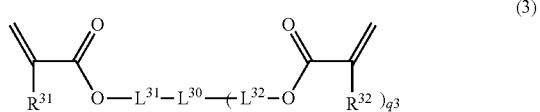

(3)

$L^{30}$ is a (q3+1)-valent linking group, and has the same definition as $L^2$. Provided that as a preferred range, a group having the hydrocarbon aromatic ring aCy (the number of the carbon atoms is preferably 6 to 22, more preferably 6 to 18, and still more preferably 6 to 10), a group having an alkane structure (the number of the carbon atoms is preferably 2 to 40, more preferably 4 to 30, and still more preferably 6 to 24), an (oligo)alkyleneoxy group (the number of carbon atoms in an alkylene group in one constitutional unit is preferably 1 to 12, more preferably 1 to 6, and still more preferably 1 to 3; and the number of repetitions is preferably 1 to 50, more preferably 1 to 40, and still more preferably 1 to 30), or a combination thereof is preferable. $L^{30}$ may have the substituent T. A plurality of substituents T may be bonded to each other to form a ring. In a case where there are the plurality of substituents T, the plurality of substituents T may be the same as or different from each other.

$R^{31}$ and $R^{32}$ each independently represent a hydrogen atom or a methyl group.

$L^{31}$ and $L^{32}$ each independently represent a single bond or the linking group Lh having a heteroatom. $L^{30}$ and $L^{31}$ or $L^{32}$ may be bonded to each other via or without via the linking group L to form a ring. $L^{30}$, $L^{31}$, and $L^{32}$ may have the substituent T. A plurality of substituents T may be bonded to each other to form a ring. In a case where there are the plurality of substituents T, the plurality of substituents T may be the same as or different from each other. $L^{31}$ and $L^{32}$ may be bonded to each other or to $L^{30}$ to form a ring.

q3 is an integer of 0 to 5, preferably an integer of 1 to 5, more preferably 1 to 3, and still more preferably 1 or 2. In a case where q3 is 0, $L^{30}$ becomes a substituent. In a case where $L^{30}$ is a substituent, a moiety of $L^{32}$ becomes a hydrogen atom.

The compound represented by Formula (3) preferably has the polar functional group Tf in the molecule. The polar functional group Tf may be formed with the carbonyl group and the oxygen atom in the formula.

A content ratio of the specific compound in the composition for forming an underlayer film for imprinting is preferably 0.01% by mass or more, more preferably 0.05% by mass or more, and still more preferably 0.1% by mass or more. The upper limit is preferably 10% by mass or less, more preferably 7% by mass or less, still more preferably 5% by mass or less, even more preferably 4% by mass or less, further still more preferably 3% by mass or less, and may be 1% by mass or less, and may be 0.7% by mass or less.

The content ratio of the specific compound in the non-volatile component is preferably 5% by mass or more, more preferably 20% by mass or more, and still more preferably 30% by mass or more. The upper limit is preferably 90% by mass or less, more preferably 70% by mass or less, and still more preferably 60% by mass or less.

By setting the amount to be equal to or more than the lower limit value, the effect caused by formulation of the polymer can be suitably exhibited, and a uniform thin film can be easily prepared. On the other hand, by setting the amount to be equal to or less than the upper limit value, the effect of using a solvent is suitably exhibited, and a uniform film can be easily formed over a wide area.

The content of the specific compound used in the composition for forming an underlayer film for imprinting is preferably 10 parts by mass or more and more preferably 25 parts by mass or more, and may be 40 parts by mass or more, 60 parts by mass or more, 80 parts by mass or more, or 90 parts by mass or more, with respect to 100 parts by mass of the specific polymer. The upper limit is preferably 500 parts by mass or less and more preferably 400 parts by mass or less, and may be 300 parts by mass or less, 200 parts by mass or less, 150 parts by mass or less, 130 parts by mass or less, or 110 parts by mass or less. With such a configuration, it is possible to exhibit well-balanced adhesiveness and filling properties.

Only one kind of the specific compound may be used, or two or more kinds thereof may be used. In a case where two or more kinds thereof are used, the total amount is preferably within the above range.

The viscosity of the specific compound is preferably 3,000 mPa·s or lower, more preferably 2,000 mPa·s or lower, still more preferably 1,500 mPa·s or lower, and even more preferably 1,000 mPa·s or lower. The lower limit of the viscosity of the specific compound is preferably 5 mPa·s or higher and more preferably 10 mPa·s or higher, and may be 20 mPa·s or higher or further 50 mPa·s or higher. By setting the viscosity within a suitable range, an interaction with the specific polymer is enhanced, the compound also suitably acts on the curable composition for imprinting, and wettability is further enhanced, which is preferable. Furthermore, as the viscosity of the specific compound, a value measured based on a method described in Example described later is adopted.

The surface tension of the specific compound at 23° C. is preferably 37.0 mN/m or higher and more preferably 38.0 mN/m or higher. The upper limit of the surface tension is not particularly limited, but is, for example, 48.0 mN/m or lower.

The surface tension (η1) of the specific compound contained in the composition for forming an underlayer film for imprinting is preferably higher than surface tension (η2) of the component with a largest formulation amount in the curable composition for imprinting. The difference is η1−η2, and is preferably 2.0 mN/m or higher, more preferably 2.5 mN/m or higher, and still more preferably 3.0 mN/m or higher. With such a configuration, wettability with the curable composition for imprinting can be further improved.

As the surface tension, a value measured based on a method described in Example described later is adopted.

Examples of the specific compound include compounds used in the following Examples, but the present invention is not construed as being limited thereto.

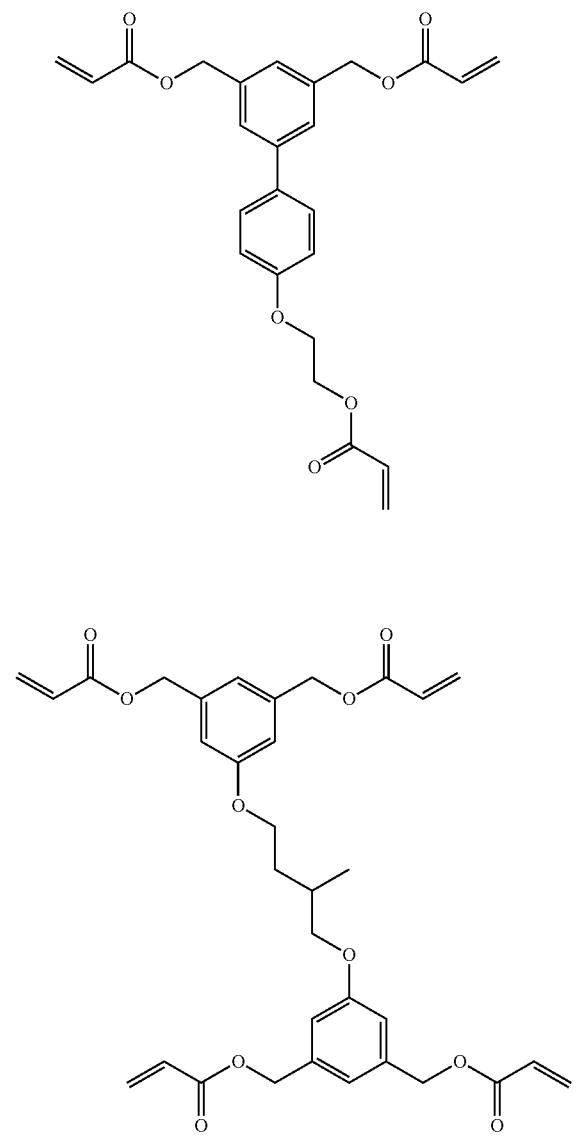

-continued

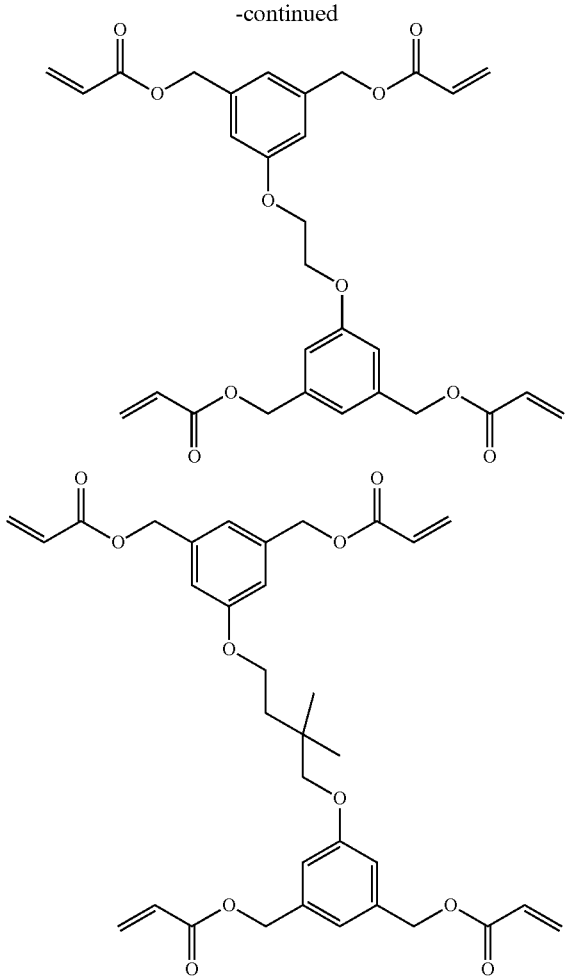

<<Alkylene Glycol Compound>>

The composition for forming an underlayer film for imprinting may contain an alkylene glycol compound. The number of alkylene glycol constitutional units contained in the alkylene glycol compound is preferably 3 to 1,000, more preferably 4 to 500, still more preferably 5 to 100, and even more preferably 5 to 50. A weight-average molecular weight (Mw) of the alkylene glycol compound is preferably 150 to 10,000, more preferably 200 to 5,000, still more preferably 300 to 3,000, and even more preferably 300 to 1,000.

Examples of the alkylene glycol compound include polyethylene glycol, polypropylene glycol, mono- or di-methyl ether thereof, mono- or di-octyl ether, mono- or di-nonyl ether, mono- or di-decyl ether, monostearate, monooleate, monoadipate, and monosuccinate, and polyethylene glycol and polypropylene glycol are preferable.

Surface tension of the alkylene glycol compound at 23° C. is preferably 38.0 mN/m or higher and more preferably 40.0 mN/m or higher. The upper limit of the surface tension is not particularly limited, but is, for example, 48.0 mN/m or lower. By formulating such a compound, the wettability of the curable composition for imprinting provided immediately above the underlayer film can be further improved.

In a case where the alkylene glycol compound is contained, the content thereof is 40% by mass or less, preferably 30% by mass or less, more preferably 20% by mass or less, and still more preferably 1% to 15% by mass with respect to the non-volatile component.

Only one kind of the alkylene glycol compound may be used, or two or more kinds thereof may be used. In a case where two or more kinds thereof are used, the total amount is preferably within the above range.

<<Polymerization Initiator>>

The composition for forming an underlayer film for imprinting may contain a polymerization initiator and preferably contains at least one kind of a thermal polymerization initiator or a photopolymerization initiator. By containing the polymerization initiator, a reaction of a polymerizable group contained in the composition for forming an underlayer film for imprinting is promoted, and the adhesiveness tends to be improved. From the viewpoint that crosslinking reactivity with the curable composition for imprinting is improved, a photopolymerization initiator is preferable. As the photopolymerization initiator, a radical polymerization initiator and a cationic polymerization initiator are preferable, and a radical polymerization initiator is more preferable. Moreover, in the present invention, a plurality of kinds of photopolymerization initiators may be used in combination.

As a photoradical polymerization initiator, a known compound can be optionally used. Examples thereof include a halogenated hydrocarbon derivative (for example, a compound having a triazine skeleton, a compound having an oxadiazole skeleton, a compound having a trihalomethyl group, and the like), an acylphosphine compound such as acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex. For the details thereof, reference can be made to the description in paragraphs 0165 to 0182 of JP2016-027357A, the contents of which are incorporated in the present specification.

Examples of the acylphosphine compound include 2,4,6-trimethylbenzoyl-diphenyl-phosphine oxide. Moreover, IRGACURE-819, IRGACURE 1173, and IRGACURE-TPO (trade names: all are manufactured by BASF SE), which are commercially available products, can be used.

In a case where the photopolymerization initiator used in the composition for forming an underlayer film for imprinting is formulated, a content thereof in the non-volatile component is, for example, 0.0001% to 5% by mass, preferably 0.0005% to 3% by mass, and more preferably 0.01% to 1% by mass. In a case where two or more kinds of photopolymerization initiators are used, the total amount is within the above range.

<<Other Non-Volatile Components>>

As the non-volatile component formulated in the composition for forming an underlayer film for imprinting, in addition to the above compounds, one or more kinds of a thermal polymerization initiator, a polymerization inhibitor, an antioxidant, a leveling agent, a thickener, a surfactant, or the like may be contained.

As the thermal polymerization initiator or the like, the respective components described in JP2013-036027A, JP2014-090133A, and JP2013-189537A can be used. Also regarding the content or the like, reference can be made to the description in the above publications.

In addition, in the present invention, the composition for forming an underlayer film for imprinting may not substantially contain a surfactant. The expression "not substantially contain" means that the content thereof is 0.1% by mass or less with respect to the non-volatile component in the composition for forming an underlayer film for imprinting.

<<Solvent for Underlayer Film>>

The composition for forming an underlayer film for imprinting preferably contains a solvent (solvent for an underlayer film). For example, the solvent is preferably a compound which is liquid at 23° C. and has a boiling point of 250° C. or lower. In general, the non-volatile component finally forms an underlayer film. A content of the solvent for an underlayer film in the composition for forming an underlayer film for imprinting is preferably 99.0% by mass or more and more preferably 99.5% by mass or more, and may be 99.6% by mass or more. In the present invention, the liquid refers to a component having a viscosity at 23° C. of 100,000 mPa·s or less.

The composition for forming an underlayer film for imprinting may contain only one kind of the solvent or two or more kinds thereof. In a case where two or more kinds thereof are contained, the total amount is preferably within the above range.

The boiling point of the solvent for an underlayer film is preferably 230° C. or lower, more preferably 200° C. or lower, still more preferably 180° C. or lower, even more preferably 160° C. or lower, and further still more preferably 130° C. or lower. The lower limit value is practically 23° C. but more practically 60° C. or higher. By setting the boiling point within the above range, the solvent can be easily removed from the underlayer film, which is preferable.

The solvent for an underlayer film is preferably an organic solvent. The solvent is preferably a solvent having any one or more of an ester group, a carbonyl group, a hydroxyl group, and an ether group. Among them, an aprotic polar solvent is preferably used.

As specific examples thereof, alkoxy alcohol, propylene glycol monoalkyl ether carboxylate, propylene glycol monoalkyl ether, lactate, acetate, alkoxypropionate, chain-like ketone, cyclic ketone, lactone, and alkylene carbonate are selected.

Examples of the alkoxy alcohol include methoxyethanol, ethoxyethanol, methoxypropanol (for example, 1-methoxy-2-propanol), ethoxypropanol (for example, 1-ethoxy-2-propanol), propoxypropanol (for example, 1-propoxy-2-propanol), methoxybutanol (for example, 1-methoxy-2-butanol and 1-methoxy-3-butanol), ethoxybutanol (for example, 1-ethoxy-2-butanol and 1-ethoxy-3-butanol), and methylpentanol (for example, 4-methyl-2-pentanol).

As the propylene glycol monoalkyl ether carboxylate, at least one selected from the group consisting of propylene glycol monomethyl ether acetate, propylene glycol monomethyl ether propionate, and propylene glycol monoethyl ether acetate is preferable and propylene glycol monomethyl ether acetate is particularly preferable.

In addition, as the propylene glycol monoalkyl ether, propylene glycol monomethyl ether or propylene glycol monoethyl ether is preferable.

As the lactate, ethyl lactate, butyl lactate, or propyl lactate is preferable.

As the acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxypropionate, methyl 3-methoxypropionate (MMP) or ethyl 3-ethoxypropionate (EEP) is preferable.

As the chain-like ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetylcarbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone is preferable.

As the alkylene carbonate, propylene carbonate is preferable.

In addition to the above components, an ester-based solvent having 7 or more (preferably 7 to 14, more preferably 7 to 12, and still more preferably 7 to 10) carbon atoms, and having 2 or less heteroatoms is preferably used.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

In addition, a solvent having a flash point (hereinafter, also referred to as a fp) of 30° C. or higher is also preferably used. As such a component, propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 30° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among them, propylene glycol monoethyl ether, ethyl lactate, pentyl acetate, or cyclohexanone is more preferable, and propylene glycol monoethyl ether or ethyl lactate is particularly preferable.

Examples of a solvent which is particularly preferable as the solvent for an underlayer film include at least one kind selected from the group consisting of water, 1-methoxy-2-propanol, propylene glycol monomethyl ether acetate (PGMEA), ethoxyethyl propionate, cyclohexanone, 2-heptanone, γ-butyrolactone, butyl acetate, propylene glycol monomethyl ether (PGME), ethyl lactate, and 4-methyl-2-pentanol, and at least one kind selected from the group consisting of 1-methoxy-2-propanol, PGMEA, and butyl acetate is more preferable.

As a storage container of the composition for forming an underlayer film for imprinting, a storage container known in the related art can be used. Moreover, as the storage container, for the purpose of preventing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A.

<<Surface Free Energy>>

Surface free energy of an underlayer film for imprinting which is formed of the composition for forming an underlayer film for imprinting according to the embodiment of the present invention is preferably 30 mN/m or more, more preferably 40 mN/m or more, and still more preferably 50 mN/m or more. The upper limit is preferably 200 mN/m or more, more preferably 150 mN/m or more, and still more preferably 100 mN/m or more.

For example, the surface free energy can be measured at 23° C. using a surface tensiometer SURFACE TENS-IOMETER CBVP-A3 manufactured by Kyowa Interface Science Co., LTD. and a glass plate.

<Curable Composition for Imprinting>

The curable composition for imprinting contains a compound having ΔHSP, which is a Hansen solubility parameter distance from the specific compound, of 2.5 or less. The compound is a component (maximum amount component) with the highest content contained in the curable composition for imprinting. In the curable composition for imprinting, the maximum amount component accounts for preferably 20% by mass or more, more preferably 30% by mass or more, still more preferably 40% by mass or more, even more preferably 50% by mass or more, and further still more preferably 51% by mass or more, of the composition. The upper limit value is not particularly limited, but can be, for example, 95% by mass or less, further 85% by mass or less, and particularly 75% by mass or less.

In the Hansen solubility parameter (HSP) vector of the maximum amount component,
(i) a dispersion element component (d component) is preferably 14.0 to 20.0, more preferably 15.0 to 19.0, and still more preferably 16.0 to 18.5,
(ii) a polarity element component (p component) is preferably 3.5 to 8.0, more preferably 3.8 to 6.0, and still more preferably 4.0 to 5.0, and
(iii) a hydrogen bond element component (h component) is preferably 4.0 to 8.0, more preferably 4.7 to 7.0, and still more preferably 5.2 to 6.5.

The dispersion element component, the polarity element component, and the hydrogen bond element component in the HSP vector of the maximum amount component are respectively set by methods described in Examples described later. Furthermore, in a case where there are a plurality of contained components of the curable composition for imprinting, it is more preferable that the maximum amount component satisfies the above range and components other than the maximum amount component also satisfy the above range, and still more preferable that components accounting for 80% by mass or more of the curable composition for imprinting satisfy the above range.

<<Polymerizable Compound>>

The curable composition for imprinting preferably contains a polymerizable compound, and it is more preferable that the polymerizable compound constitutes the maximum amount component. The polymerizable compound may have one polymerizable functional group or two or more polymerizable functional groups in one molecule. At least one kind of polymerizable compound contained in the curable composition for imprinting preferably has two to five polymerizable functional groups, more preferably has two to four polymerizable functional groups, still more preferably has two or three polymerizable functional groups, and even more preferably has three polymerizable functional groups, in one molecule.

At least one kind of polymerizable compound contained in the curable composition for imprinting preferably contains at least one of an aromatic ring (for example, the hydrocarbon aromatic ring aCy) or an alicycle, and more preferably contains an aromatic ring. The aromatic ring is preferably a benzene ring.

The molecular weight of the polymerizable compound is preferably 100 to 900.

The at least one kind of polymerizable compound is preferably represented by Formula (I-1).

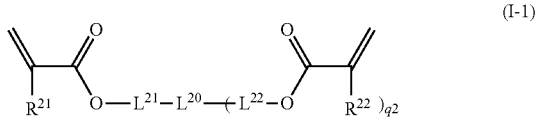

(I-1)

$L^{20}$ is a group having the same definition as $L^{30}$ in Formula (3), and preferred ranges thereof are also the same.

$R^{21}$ and $R^{22}$ each independently represent a hydrogen atom or a methyl group.

$L^{21}$ and $L^{22}$ each independently represent a single bond or the linking group Lh having a heteroatom. $L^{20}$ and $L^{21}$ or $L^{22}$ may be bonded to each other via or without via the linking group L to form a ring. $L^{20}$, $L^{21}$, and $L^{22}$ may have the substituent T. A plurality of substituents T may be bonded to each other to form a ring. In a case where there are the plurality of substituents T, the plurality of substituents T may be the same as or different from each other. Preferred examples of $L^{20}$ having a substituent include an aspect in which in a case where q2 is 0 and $L^{20}$ is a substituent at a terminal, an aromatic ring (for example, a benzene ring) constituting $L^{20}$ is substituted with an alkyl group (the number of the carbon atoms is preferably 1 to 12, more preferably 1 to 6, and still more preferably 1 to 3).

q2 is an integer of 0 to 5, preferably an integer of 0 to 3, more preferably an integer of 0 to 2, and still more preferably 0 or 1.

Examples of the polymerizable compound include compounds used in the following Examples, the compounds described in paragraphs 0017 to 0024 and Examples of JP2014-090133A, the compounds described in paragraphs 0024 to 0089 of JP2015-009171A, the compounds described in paragraphs 0023 to 0037 of JP2015-070145A, and the compounds described in paragraphs 0012 to 0039 of WO2016/152597A, but the present invention is not construed as being limited thereto.

The content of the polymerizable compound in the curable composition for imprinting is preferably 30% by mass or more, more preferably 45% by mass or more, still more preferably 50% by mass or more, and even more preferably 55% by mass or more, and may be 60% by mass or more or further 70% by mass or more. Moreover, the upper limit value is preferably less than 99% by mass and more preferably 98% by mass or less, and can also be 97% by mass or less.

It is preferable that the boiling point of the polymerizable compound is set based on a relationship with the specific compound contained in the composition for forming an underlayer film for imprinting described above and designed for formulation. The boiling point of the polymerizable compound is preferably 500° C. or lower, more preferably 450° C. or lower, and still more preferably 400° C. or lower. The lower limit value is preferably 200° C. or higher, more preferably 220° C. or higher, and still more preferably 240° C. or higher.

<<Other Components>>

The curable composition for imprinting may contain additives other than the polymerizable compound. A polymerization initiator, a surfactant, a sensitizer, a release agent, an antioxidant, a polymerization inhibitor, or the like may be contained as other additives.

Specific examples of the curable composition for imprinting that can be used in the present invention include the compositions described in JP2013-036027A, JP2014-090133A, and JP2013-189537A, the contents of which are incorporated in the present specification. Moreover, also regarding preparation of the curable composition for imprinting and a method for forming a film (pattern forming layer), reference can be made to the description in the above publications, the contents of which are incorporated in the present specification.

<<Physical Property Value or the Like>>

A viscosity of the curable composition for imprinting is preferably 20.0 mPa·s or lower, more preferably 15.0 mPa·s or lower, still more preferably 11.0 mPa·s or lower, and even more preferably 9.0 mPa·s or lower. The lower limit value of the viscosity is not particularly limited, but can be, for example, 5.0 mPa·s or higher. The viscosity is measured according to a method described in Example described later.

Surface tension (γResist) of the curable composition for imprinting is preferably 28.0 mN/m or higher and more preferably 30.0 mN/m or higher, and may be 32.0 mN/m or higher. By using the curable composition for imprinting which has high surface tension, a capillary force is increased and high-speed filling of a mold pattern with the curable composition for imprinting becomes possible. The upper limit value of the surface tension is not particularly limited, but from the viewpoint that a relationship with the underlayer film and ink jet suitability are imparted, is preferably 40.0 mN/m or lower and more preferably 38.0 mN/m or lower, and may be 36.0 mN/m or lower. The surface tension of the curable composition for imprinting is measured according to a method described in Example described later.

An Ohnishi parameter of the curable composition for imprinting is preferably 5.0 or less, more preferably 4.0 or less, and still more preferably 3.7 or less. The lower limit value of the Ohnishi parameter of the curable composition for imprinting is not particularly limited, but may be, for example, 1.0 or more or further 2.0 or more.

For each of the non-volatile components of the curable composition for imprinting, the Ohnishi parameter can be determined by substituting the number of carbon atoms, the number of hydrogen atoms, and the number of oxygen atoms in all constituent components into the following expression.

Ohnishi parameter=sum of number of carbon atoms, number of hydrogen atoms, and number of oxygen atoms/(number of carbon atoms−number of oxygen atoms)

In the present invention, a content of the solvent in the curable composition for imprinting is preferably 5% by mass or less, more preferably 3% by mass or less, and still more preferably 1% by mass or less with respect to the curable composition for imprinting.

The curable composition for imprinting can adopt an aspect in which a polymer (a polymer having preferably a weight-average molecular weight of more than 1,000, more preferably a weight-average molecular weight of more than 2,000, and still more preferably a weight-average molecular weight of 10,000 or more) is not substantially contained. The expression "polymer is not substantially contained" means, for example, that the content of the polymer is 0.01% by mass or less with respect to the curable composition for imprinting, and it is preferable that the content is 0.005% by mass or less and more preferable that the polymer is not contained at all.

As a storage container of the curable composition for imprinting used in the present invention, a storage container known in the related art can be used. Moreover, as the storage container, for the purpose of preventing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A.

<Laminate and Production Method Therefor>

As a preferred embodiment of the kit according to the embodiment of the present invention, a laminate formed from the kit is exemplified. The laminate according to the present embodiment preferably includes an underlayer film formed of the composition for forming an underlayer film for imprinting, and an imprint layer which is formed of the curable composition for imprinting and is positioned on a surface of the underlayer film. The production method therefor is not particularly limited, but a production method using the kit, and including applying a curable composition for imprinting onto a surface of an underlayer film formed of the composition for forming an underlayer film for imprinting is exemplified. At this time, the curable composition for imprinting is preferably applied onto the surface of the underlayer film by an ink jet method (IJ method). It is preferable that the method for producing a laminate further includes a step of applying the composition for forming an underlayer film for imprinting in a layer form onto a substrate, and heating the composition for forming an underlayer film for imprinting applied in a layer form at 40° C. to 70° C. (preferably 50° C. to 65° C.).

<Pattern and Pattern Forming Method>

A pattern forming method according to the preferred embodiment of the present invention includes a step of applying the composition for forming an underlayer film for imprinting to a substrate to form an underlayer film for imprinting (underlayer film formation step); a step of applying a curable composition for imprinting to the underlayer film (application step); and a step of exposing the curable composition for imprinting in a state where a mold is brought into contact with the curable composition for imprinting and a step of peeling off the mold (mold contact step, light irradiation step, and release step). The curable composition for imprinting is preferably provided on the surface of the underlayer film.

Hereinafter, a pattern forming method (method for producing a cured product pattern) will be described with reference to FIGS. 1A to 1G. It goes without saying that the configuration of the present invention is not limited by the drawings.

<<Underlayer Film Formation Step>>

In the underlayer film formation step, as shown in FIGS. 1A and 1B, an underlayer film 2 is formed on a substrate 1. The underlayer film is preferably formed by applying the composition for forming an underlayer film for imprinting in a layer form onto the substrate. Below the underlayer film, an adhesive film may be provided on the surface of the substrate 1.

A method for applying the composition for forming an underlayer film for imprinting onto the substrate is not particularly limited, and a generally well-known application method can be adopted. Specific examples of the application method include a dip coating method, an air knife coating method, a curtain coating method, a wire bar coating method, a gravure coating method, an extrusion coating method, a spin coating method, a slit scanning method, and an ink jet method, and a spin coating method is preferable.

Furthermore, after the composition for forming an underlayer film for imprinting is applied in a layer form onto the substrate, preferably, the solvent is volatilized (dried) by heat to form an underlayer film which is a thin film.

A thickness of the underlayer film 2 is preferably 2 nm or more, more preferably 3 nm or more, and still more preferably 4 nm or more, and may be 5 nm or more, 7 nm or more, or 10 nm or more. Moreover, the thickness of the underlayer film is preferably 40 nm or less, more preferably 30 nm or less, and still more preferably 20 nm or less, and may be 15 nm or less. By setting the film thickness to be equal to or more than the lower limit value, extendability (wettability) of the curable composition for imprinting on the underlayer film is improved, and a uniform residual film can be formed after imprint. By setting the film thickness to be equal to or less than the upper limit value, the residual film after imprint becomes thin, unevenness in the film thickness is less likely to occur, and uniformity of the residual film tends to be improved.

A material of the substrate is not particularly limited, reference can be made to the description in paragraph 0103 of JP2010-109092A (the publication number of the corresponding US application is US2011/0183127), the contents of which are incorporated in the present specification. In the present invention, examples thereof include a silicon substrate, a glass substrate, a quartz substrate, a sapphire substrate, a silicon carbide (silicon carbide) substrate, a gallium nitride substrate, an aluminum substrate, an amorphous aluminum oxide substrate, a polycrystalline aluminum oxide substrate, and a substrate made of GaAsP, GaP, AlGaAs, InGaN, GaN, AlGaN, ZnSe, AlGa, InP, or ZnO. Furthermore, specific examples of a material of the glass substrate include aluminosilicate glass, aluminoborosilicate glass, and barium borosilicate glass. In the present invention, a silicon substrate is preferable.

<<Application Step>>

In the application step, for example, as shown in FIG. 1C, a curable composition 3 for imprinting is applied to the surface of the underlayer film 2.

A method for applying the curable composition for imprinting is not particularly limited, reference can be made to the description in paragraph 0102 of JP2010-109092A (the publication number of the corresponding US application is US2011/0183127), the contents of which are incorporated in the present specification. The curable composition for imprinting is preferably applied onto the surface of the underlayer film by an ink jet method. Moreover, the curable composition for imprinting may be applied through multiple applying. In a method for arranging liquid droplets on the surface of the underlayer film by the ink jet method or the like, an amount of the liquid droplet is preferably about 1 to 20 pL, and the liquid droplets are preferably arranged on the surface of the underlayer film at an interval between liquid droplets. The interval between liquid droplets is preferably an interval of 10 to 1,000 μm. In a case of the ink jet method, the interval between liquid droplets is an arrangement interval between ink jet nozzles.

Furthermore, a volume ratio of the underlayer film 2 to the film-like curable composition 3 for imprinting applied onto the underlayer film is preferably 1:1 to 500, more preferably 1:10 to 300, and still more preferably 1:50 to 200.

In addition, the method for producing a laminate according to the preferred embodiment of the present invention is a production method using the kit according to the embodiment of the present invention, and includes applying the curable composition for imprinting onto the surface of the underlayer film formed of the composition for forming an underlayer film for imprinting. It is preferable that the method for producing a laminate according to the preferred embodiment of the present invention further includes a step of applying the composition for forming an underlayer film for imprinting in a layer form onto a substrate, and heating (baking) the composition for forming an underlayer film for imprinting applied in a layer form preferably at 100° C. to 300° C., more preferably at 130° C. to 260° C., and still more preferably at 150° C. to 230° C. A heating time is preferably 30 seconds to 5 minutes.

<<Mold Contact Step>>

In the mold contact step, for example, as shown in FIG. 1D, the curable composition 3 for imprinting is brought into contact with a mold 4 having a pattern for transferring a pattern shape. Through such a step, a desired cured product pattern (imprint pattern) is obtained.

Specifically, in order to transfer a desired pattern to the film-like curable composition for imprinting, the mold 4 is pressed against the surface of the film-like curable composition 3 for imprinting.

The mold may be a light-transmitting mold or a non-light-transmitting mold. In a case where the light-transmitting mold is used, it is preferable that the curable composition for imprinting 3 is irradiated with light from a mold side. On the other hand, in a case where the non-light-transmitting mold is used, it is preferable that a light-transmitting substrate is used as a substrate and light is radiated from a substrate side. In the present invention, it is more preferable that the light-transmitting mold is used and light is radiated from the mold side.

A mold which can be used in the present invention is a mold having a pattern to be transferred. The pattern of the mold can be formed according to a desired processing accuracy, for example, by photolithography, electron beam lithography, or the like. In the present invention, a method for producing a mold pattern is not particularly limited. Moreover, a pattern formed by the method for producing a cured product pattern according to the preferred embodiment of the present invention can be used as a mold.

A material constituting the light-transmitting mold used in the present invention is not particularly limited, but examples thereof include glass, quartz, a light-transmitting resin such as polymethyl methacrylate (PMMA) and a polycarbonate resin, a transparent metal vapor-deposited film, a flexible film such as polydimethylsiloxane, a photo-cured film, and a metal film, and quartz is preferable.

A non-light-transmission-type mold material used in a case where a light-transmitting substrate is used in the present invention is not particularly limited, but may be any material having a predetermined strength. Specific examples thereof include a ceramic material, a vapor-deposited film, a magnetic film, a reflective film, a substrate of a metal such as Ni, Cu, Cr, and Fe, and a substrate of SiC, silicon, silicon nitride, polysilicon, silicon oxide, or amorphous silicon, but there is no particular restriction.

In the method for producing a cured product pattern, in a case where imprint lithography is performed using the curable composition for imprinting, mold pressure is preferably set to 10 atm or less. By setting the mold pressure to 10 atm or less, the mold or the substrate is less likely to be deformed and the pattern accuracy tends to be improved. Moreover, also from the viewpoint that a device tends to be reduced in size due to low pressure, the above range is preferable. The mold pressure is preferably selected from a range in which the residual film of the curable composition for imprinting corresponding to a projection part of the mold is reduced while uniformity of mold transfer can be ensured.

In addition, it is also preferable that the contact between the curable composition for imprinting and the mold is performed under an atmosphere containing a helium gas, a condensable gas, or both a helium gas and a condensable gas.

<<Light Irradiation Step>>

In the light irradiation step, the curable composition for imprinting is irradiated with light to form a cured product. An irradiation dose of light irradiation in the light irradiation step may be sufficiently larger than the minimum irradiation dose required for curing. The irradiation dose required for curing is appropriately determined by examining consumption of an unsaturated bond of the curable composition for imprinting or the like.

A kind of light to be radiated is not particularly limited, but ultraviolet light is exemplified.

In addition, in the imprint lithography applied to the present invention, a temperature of the substrate during light irradiation is usually room temperature, but in order to increase reactivity, light irradiation may be performed while heating. Since setting a vacuum state as a stage prior to the light irradiation is effective in preventing bubbles from being mixed, suppressing a decrease in reactivity due to oxygen mixing, and improving adhesiveness between the mold and the curable composition for imprinting, the light irradiation may be performed in a vacuum state. Moreover, in the method for producing a cured product pattern, a preferred degree of vacuum during the light irradiation is in a range of $10^{-1}$ Pa to normal pressure.

At the time of exposure, exposure illuminance is preferably in a range of 1 to 500 mW/cm$^2$ and more preferably in a range of 10 to 400 mW/cm$^2$. An exposure time is not particularly limited, but is preferably 0.01 to 10 seconds and more preferably 0.5 to 1 second. An exposure dose is preferably in a range of 5 to 1000 mJ/cm$^2$ and more preferably in a range of 10 to 500 mJ/cm$^2$.

In the method for producing a cured product pattern, after the film-like curable composition for imprinting (pattern forming layer) is cured by the light irradiation, as necessary, a step of applying heat to the cured pattern to further cure the pattern may be included. A temperature for heating and curing the curable composition for imprinting after the light irradiation is preferably 150° C. to 280° C. and more preferably 200° C. to 250° C. Moreover, a time for applying heat is preferably 5 to 60 minutes and more preferably 15 to 45 minutes.

<<Release Step>>

In the release step, the cured product and the mold are separated from each other (FIG. 1E). The obtained cured product pattern can be used for various uses as described later.

That is, the present invention discloses a laminate further having the cured product pattern formed from the curable composition for imprinting on the surface of the underlayer film. Moreover, a thickness of the pattern forming layer consisting of the curable composition for imprinting used in the present invention varies depending on intended uses, but is about 0.01 μm to 30 μm.

Furthermore, as described later, etching or the like can also be performed.

<Cured Product Pattern and Application Thereof>

As described above, the cured product pattern formed by the method for producing a cured product pattern can be used as a permanent film used for a liquid crystal display device (LCD) or the like, or an etching resist (mask for lithography) for manufacturing a semiconductor element. In particular, the present invention discloses a method for manufacturing a circuit board, which includes a step of obtaining a cured product pattern by the method for producing a cured product pattern according to the preferred embodiment of the present invention. The method for manufacturing a circuit board according to the preferred embodiment of the present invention may further include a step of performing etching or ion implantation on the substrate using the cured product pattern obtained by the method for producing a cured product pattern a mask and a step of forming an electronic member. The circuit board is preferably a semiconductor element. That is, the present invention discloses a method for manufacturing a semiconductor device, which includes the pattern forming method. Moreover, the present invention discloses a method for manufacturing electronic equipment, which includes a step of obtaining a circuit board by the method for manufacturing a circuit board and a step of connecting the circuit board and a control mechanism for controlling the circuit board.

In addition, a grid pattern is formed on a glass substrate of the liquid crystal display device using the pattern formed by the method for producing a cured product pattern, and thus a polarizing plate having low reflection or absorption and a large screen size (for example, 55 inches or more than 60 inches) can be manufactured at low cost. For example, the polarizing plate described in JP2015-132825A or WO2011/132649A can be manufactured. Moreover, 1 inch is 25.4 mm.

The cured product pattern formed in the present invention is also useful as an etching resist (mask for lithography) as shown in FIGS. 1F and 1G. In a case where the cured product pattern is used as an etching resist, first, a silicon substrate (silicon wafer or the like) in which a thin film such as SiO$_2$ is formed or the like is used as a substrate, and a fine cured product pattern of a nano or micron order is formed on the substrate by the method for producing a cured product pattern. The present invention is particularly advantageous in that a fine pattern of a nano order can be formed, and a pattern having a size of 50 nm or less and particularly 30 nm or less can also be formed. The lower limit value of the size of the cured product pattern formed by the method for producing a cured product pattern is not particularly limited, but can be, for example, 1 nm or more.

Furthermore, the present invention also discloses a method for producing a mold for imprinting, which includes a step of obtaining a cured product pattern on the substrate by the method for producing a cured product pattern according to the preferred embodiment of the present invention and a step of etching the substrate using the obtained cured product pattern.

By performing etching with an etching gas such as hydrogen fluoride or the like in a case of wet etching and CF$_4$ or the like in a case of dry etching, a desired cured product pattern can be formed on the substrate. The cured product pattern has favorable etching resistance particularly to dry etching. That is, the pattern formed by the method for producing a cured product pattern is preferably used as a mask for lithography.

FIG. 2 is a plan view schematically showing a state of wet spreading of a curable composition for imprinting in a case where the curable composition for imprinting is applied onto a surface of an underlayer film by an ink jet method. In a case where the curable composition for imprinting is applied by the ink jet (IJ) method, for example, as shown in the same drawing, liquid droplets of a curable composition 22 for imprinting are added dropwise onto a surface of an underlayer film 21 at equal intervals ((a) of FIG. 2). In a case where a mold is brought into contact with the liquid droplets, the liquid droplets are spread on the underlayer film 21 and become film-like curable compositions 22a, 22b, and 22c for imprinting ((b), (c), and (d) of FIG. 2). However, in a case where the curable composition for imprinting is not uniformly spread and, for example, wet spreading is stopped in (c) of FIG. 2, a film which is not completely spread in a state of the curable composition 22b for imprinting is formed on the underlayer film 21. That is, a region 23 having a small film thickness or no film may be generated. In this case, a portion of a pattern of the mold, which is not sufficiently filled with the curable composition for imprinting, is generated, and a portion without a pattern is formed in an imprint layer. For example, in a case where etching is performed using a pattern of the imprint layer having a defect or a portion with an insufficient thickness in such a part as a mask, etching unevenness occurs in the region 23 having a small film thickness or no film and the other region 22b, and it becomes difficult to uniformly etch and transfer a desired pattern shape over the entire imprint region.

On the other hand, according to the composition for forming an underlayer film for imprinting according to the embodiment of the present invention, the interfacial tension between the underlayer film formed of the composition and the curable composition for imprinting is improved, and the wettability is improved. Therefore, the curable composition 22c for imprinting which is more surely spread to every corner in a state of (d) of FIG. 2 is obtained. As a result, the entire mold is accurately and sufficiently filled with the curable composition for imprinting, and favorable patterning without unevenness in the thickness can be achieved in the formed imprint layer. Moreover, improvement in filling properties enables high-speed imprint, which can lead to improvement in throughput.

Furthermore, in the above description, the action mechanism according to the preferred embodiment of the present invention has been described with the example in which the curable composition for imprinting is applied onto the underlayer film by the ink jet method, but the present invention is not construed as being limited thereto. For example, also in screen coating or spin coating, favorable wettability and excellent filling properties lead to advantages in processing and product quality, and the effects of the present invention can be suitably exhibited.

Specifically, the pattern formed in the present invention can be preferably used for producing a recording medium such as a magnetic disc, a light-receiving element such as a solid-state imaging element, a light emitting element such as a light emitting diode (LED) and organic electroluminescence (organic EL), an optical device such as a liquid crystal display device (LCD), an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

Examples

Hereinafter, the present invention will be described more specifically with reference to Examples. The materials, the used amounts, the ratios, the treatment details, the treatment procedures, and the like shown in the following Examples can be appropriately modified without departing from the spirit of the present invention. Therefore, the scope of the present invention is not limited to the specific examples described below.

<Preparation of Composition for Forming Underlayer Film for Imprinting>

Respective compounds listed in Tables 1 to 3 below were formulated to prepare a composition for forming an underlayer film for imprinting. The composition was filtered with a nylon filter having a filter diameter of 0.02 μm and a polytetrafluoroethylene (PTFE) filter having a filter diameter of 0.001 μm.

<Preparation of Curable Composition for Imprinting>

A curable composition for imprinting was prepared by mixing various compounds listed in Table 4 below, and further adding 4-hydroxy-2,2,6,6-tetramethylpiperidine-1-oxyl free radical (manufactured by Tokyo Chemical Industry Co., Ltd.) as a polymerization inhibitor in an amount of 200 ppm by mass (0.02% by mass) with respect to the total amount of polymerizable compounds. The composition was filtered with a nylon filter having a filter diameter of 0.02 μm and a polytetrafluoroethylene (PTFE) filter having a filter diameter of 0.001 μm.

<Calculation of Hansen Solubility Parameter Distance (ΔHSP) and Boiling Point>

The Hansen solubility parameter and the boiling point were calculated with HSP calculation software HSPiP. Specifically, respective components (d component, p component, and h component) of the Hansen solubility parameter vector were calculated by inputting a structural formula of each compound in a SMILES format into the above software.

The Hansen solubility parameter distance (ΔHSP) was calculated by obtaining ΔD, ΔP, and ΔH respectively from respective components (d component, p component, and h component) of a Hansen solubility parameter of the corresponding component and applying ΔD, ΔP, and ΔH to Expression (1).

Furthermore, in a case where there were a plurality of corresponding components, a calculated value for a compound (maximum amount component) with a largest formulation amount (mass) was adopted (in a case where formulation amounts of the corresponding components are the same, a calculated value for a compound having higher surface tension was adopted).

<Method for Measuring Molecular Weight>

A weight-average molecular weight (Mw) of the resin was defined as a value in terms of polystyrene according to gel permeation chromatography (GPC measurement). HLC-8220 (manufactured by TOSOH CORPORATION) was used as a device, and GUARD COLUMN HZ-L, TSKgel Super HZM-M, TSKgel Super HZ4000, TSKgel Super HZ3000, and TSKgel Super HZ2000 (manufactured by TOSOH CORPORATION) were used as columns. As an eluent, tetrahydrofuran (THF) was used. For detection, a detector of UV rays (ultraviolet rays) having a wavelength of 254 nm was used.

<Measurement of Viscosity>

The viscosity was measured using E-type rotational viscometers RE85L (measurement range: 0.6 to 1,200 mPa·s) and RE85H (measurement range: 6.4 to 12,800 mPa·s) manufactured by TOM SANGYO CO., LTD. and a standard cone rotor (1°34'×R24) in a state where a temperature of a sample cup was adjusted to 23° C. The unit was mPa·s. Other details regarding the measurement were in conformity with JIS Z 8803:2011. Two samples were prepared for one level and were respectively measured three times. An arithmetic mean value of a total of six times was adopted as an evaluation value.

<Measurement of Surface Tension>

The surface tension was measured at 23° C. using a surface tensiometer SURFACE TENS-IOMETER CBVP-A3 manufactured by Kyowa Interface Science Co., LTD. and a glass plate. The unit was mN/m. Two samples were prepared for one level and were respectively measured three times. An arithmetic mean value of a total of six times was adopted as an evaluation value.

<Formation of Underlayer Film/Film Thickness Evaluation>

A silicon wafer (4 inches:1 inch=25.4 mm) was spin-coated with a composition for forming an underlayer film for imprinting which is prepared by formulating components listed in Tables 1 to 3, and heated at a baking temperature listed in Tables 1 to 3 using a hot plate, thereby forming an underlayer film. A thickness of the underlayer film was measured by an ellipsometer.

<Evaluation of Wettability of Ink Jet (IJ) Liquid Droplet>

The curable composition for imprinting shown in Table 4 was jetted in a liquid droplet amount of 6 pL per nozzle to the surface of the underlayer film obtained above using an ink jet printer DMP-2831 manufactured by FUJIFILM Dimatix Inc., and liquid droplets were applied on the surface of the underlayer film so that a total of 16 droplets including 4 droplets in each vertical line and 4 droplets in each horizontal line formed a square array with intervals of about 880 μm. Shapes of the liquid droplets were imaged 3 seconds after the application, and an average diameter of the liquid droplets was measured. Two samples were used for one level and were respectively measured three times. An arithmetic mean value of a total of six times was adopted as an evaluation value.

A: Average diameter of IJ liquid droplets >500 μm

B: 400 μm<average diameter of IJ liquid droplets ≤500 μm

C: 300 μm<average diameter of IJ liquid droplets ≤400 μm

D: Average diameter of IJ liquid droplets ≤300 μm

<Evaluation of Filling Properties>

The curable composition for imprinting whose temperature was adjusted to 23° C. was jetted in a liquid droplet amount of 1 pL per nozzle to the surface of the underlayer film obtained above using an ink jet printer DMP-2831 manufactured by FUJIFILM Dimatix Inc., and liquid droplets were applied on the surface of the underlayer film in a square array with intervals of about 100 μm. Subsequently, a quartz substrate was pressed against the curable composition for imprinting to flatten the curable composition for imprinting. Moreover, after exposure was performed from a mold side using a high-pressure mercury lamp under a condition of 300 mJ/cm$^2$, the quartz substrate was peeled off to obtain a flat film.

A surface of the flat film was observed using an optical microscope (STM6-LM manufactured by OLYMPUS CORPORATION), and the filling properties were evaluated according to the following standards.

A: In the imprint area, an unfilled region (region where the cured product of the curable composition for imprinting does not exist) was not generated.

B: In some regions of the imprint area, unfilling at a boundary of the ink jet liquid droplet was confirmed.

C: Over the entire imprint area, unfilling at a boundary of the ink jet liquid droplet was confirmed.

D: A region where the ink jet liquid droplets were not connected to each other and thus a flat film could not be formed was confirmed.

<Evaluation of Adhesive Force>

The curable composition for imprinting whose temperature was adjusted to 25° C. was jetted in a liquid droplet amount of 6 pL per nozzle to the surface of the underlayer film obtained above using an ink jet printer DMP-2831 manufactured by FUJIFILM Dimatix Inc., and liquid droplets were applied on the underlayer film in a square array with intervals of about 100 μm, thereby forming a pattern forming layer. Subsequently, a quartz wafer spin-coated with the composition for forming an adhesive layer described in Example 6 of JP2014-024322A was pressed against the pattern forming layer under a He atmosphere (substitution rate of 90% or more) to imprint the curable composition for imprinting. At the time when 10 seconds passed after the imprinting, exposure was performed from a mold side using a high-pressure mercury lamp under a condition of 150 mJ/cm$^2$. A force required for peeling off the mold after exposure was measured, and was defined as an adhesive force F of the underlayer film.

A: F≥30 N

B: 25 N≤F<30 N

C: 20 N≤F<25 N

D: F<20N

<Evaluation of Peeling Defect>

One of the curable compositions for imprinting whose temperature was adjusted to 25° C. was jetted in a liquid droplet amount of 6 pL per nozzle to the surface of the underlayer film obtained above using an ink jet printer DMP-2831 manufactured by FUJIFILM Dimatix Inc., and liquid droplets were applied on the underlayer film in a square array with intervals of about 100 μm, thereby forming a pattern forming layer (layer-like curable composition for imprinting). Subsequently, a quartz mold (line pattern with a line width of 28 nm and a depth of 60 nm) was pressed against the pattern forming layer under a He atmosphere (substitution rate of 90% or more) to fill the mold with the curable composition for imprinting. At the time when 10 seconds passed after the imprinting, exposure was performed from a mold side using a high-pressure mercury lamp under a condition of 150 mJ/cm$^2$, and then the mold was peeled off to transfer a pattern to the pattern forming layer. The presence or absence of peeling of the transferred pattern was confirmed by optical microscope observation (macro-observation) and SEM observation (micro-observation by a scanning electron microscope).

A: Pattern peeling was not confirmed

B: In macro-observation, no peeling was confirmed, but in micro-observation, pattern peeling was confirmed C: In macro-observation, peeling was confirmed in some regions (release end part)

D: In macro-observation, peeling was confirmed over the entire transfer area

<Evaluation of Coated Surface Condition>

Surface roughness (Ra) of the surface of the underlayer film obtained above was measured using an atomic force microscope (AFM) according to 4.2.1 of JIS B 0601. The measurement area was 10 μm square, and the measurement frequency was 0.5 Hz. The unit is nm.

A: Ra≤0.4

B: 0.4<Ra≤0.6

C: 0.6<Ra≤1.0

D: Ra>1.0

TABLE 1

|  |  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Specific polymer | 1-1 | 0.2 |  |  |  |  | 0.2 | 0.2 | 0.2 | 0.2 | 0.32 | 0.078 |
|  | 1-2 |  |  |  |  |  |  |  |  |  |  |  |
|  | 1-3 |  |  |  |  |  |  |  |  |  |  |  |
|  | 1-4 |  |  |  |  |  |  |  |  |  |  |  |
|  | 1-5 |  | 0.2 |  |  |  |  |  |  |  |  |  |
|  | 1-6 |  |  | 0.2 |  |  |  |  |  |  |  |  |
|  | 1-7 |  |  |  | 0.2 |  |  |  |  |  |  |  |
|  | 1-8 |  |  |  |  | 0.2 |  |  |  |  |  |  |
|  | 1-9 |  |  |  |  |  |  |  |  |  |  |  |
| Specific compound | 2-1 | 0.198 | 0.198 | 0.198 | 0.198 | 0.198 |  |  |  |  | 0.078 | 0.32 |
|  | 2-2 |  |  |  |  |  |  |  |  |  |  |  |
|  | 2-3 |  |  |  |  |  |  |  |  |  |  |  |
|  | 2-4 |  |  |  |  |  |  |  |  |  |  |  |
|  | 2-5 |  |  |  |  |  | 0.198 |  |  |  |  |  |
|  | 2-6 |  |  |  |  |  |  | 0.198 |  |  |  |  |
|  | 2-7 |  |  |  |  |  |  |  | 0.198 |  |  |  |
|  | 2-8 |  |  |  |  |  |  |  |  | 0.198 |  |  |
| Photopolymerization initiator | 3-1 | 0.002 | 0.002 | 0.002 | 0.002 | 0.002 | 0.002 | 0.002 | 0.002 | 0.002 | 0.002 | 0.002 |
|  | 3-2 |  |  |  |  |  |  |  |  |  |  |  |
| Solvent | 4-1 | 99.6 | 99.6 | 99.6 | 99.6 | 99.6 | 99.6 | 99.6 | 99.6 | 99.6 | 99.6 | 99.6 |
|  | 4-2 |  |  |  |  |  |  |  |  |  |  |  |
| Total |  | 100 | 100 | 100 | 100 | 100 | 100 | 100 | 100 | 100 | 100 | 100 |
| Curable composition for imprinting |  | V-1 | V-1 | V-1 | V-1 | V-1 | V-1 | V-3 | V-1 | V-1 | V-1 | V-1 |
| ΔHSP |  | 1.23 | 1.23 | 1.23 | 1.23 | 1.23 | 2.26 | 1.87 | 1.47 | 2.50 | 1.23 | 1.23 |
| Baking temperature |  | 180° C. | 180° C. | 180° C. | 180° C. | 180° C. | 180° C. | 180° C. | 180° C. | 180° C. | 180° C. | 180° C. |
| Thickness of underlayer film |  | 14 nm | 14 nm | 14 nm | 14 nm | 14 nm | 14 nm | 14 nm | 14 nm | 14 nm | 14 nm | 14 nm |
| Wettability of IJ liquid droplet |  | A | A | A | A | A | A | B | A | A | B | A |
| Filling properties |  | A | A | A | B | A | B | B | A | A | B | A |
| Adhesive force |  | A | B | A | A | A | A | A | A | B | A | B |
| Peeling defect |  | A | B | B | A | A | B | A | B | A | B | B |
| Coated surface condition |  | A | A | A | B | B | A | A | A | A | A | B |

All units related to formulation are parts by mass (the same applies to Tables 2 and 3 below)
4-1: PGMEA propylene glycol monomethyl ether acetate (the same applies to Table 3 below)

TABLE 2

|  |  | Example 12 | Example 13 | Example 14 | Example 15 | Example 16 | Example 17 | Example 18 | Example 19 | Example 20 | Example 21 | Example 22 |
|---|---|---|---|---|---|---|---|---|---|---|---|---|
| Specific polymer | 1-1 | 0.2 | 0.6 | 0.2 | 0.2 |  |  |  | 0.2 | 0.2 | 0.2 | 0.2 |
|  | 1-2 |  |  |  |  | 0.2 |  |  |  |  |  |  |
|  | 1-3 |  |  |  |  |  | 0.2 |  |  |  |  |  |
|  | 1-4 |  |  |  |  |  |  | 0.2 |  |  |  |  |
|  | 1-5 |  |  |  |  |  |  |  |  |  |  |  |
|  | 1-6 |  |  |  |  |  |  |  |  |  |  |  |
|  | 1-7 |  |  |  |  |  |  |  |  |  |  |  |
|  | 1-8 |  |  |  |  |  |  |  |  |  |  |  |
|  | 1-9 |  |  |  |  |  |  |  |  |  |  |  |
| Specific compound | 2-1 | 0.2 | 0.6 |  | 0.198 | 0.198 | 0.198 | 0.198 |  |  |  | 0.198 |
|  | 2-2 |  |  |  |  |  |  |  | 0.198 |  |  |  |
|  | 2-3 |  |  |  |  |  |  |  |  | 0.198 |  |  |
|  | 2-4 | 0.198 |  |  |  |  |  |  |  |  |  |  |
|  | 2-14 |  |  | 0.2 |  |  |  |  |  |  |  |  |
|  | 2-15 |  |  |  |  |  |  |  |  |  |  |  |
| Photopolymerization initiator | 3-1 |  |  |  | 0.002 | 0.002 | 0.002 | 0.002 | 0.002 | 0.002 | 0.002 |  |
|  | 3-2 |  |  |  |  |  |  |  |  |  |  | 0.002 |
| Solvent | 4-1 | 99.6 | 98.8 | 99.6 | 99.6 | 99.6 | 99.6 | 99.6 | 99.6 | 99.6 | 99.6 | 99.6 |
|  | 4-2 |  |  |  |  |  |  |  |  |  |  |  |
| Total |  | 100 | 100 | 100 | 100 | 100 | 100 | 100 | 100 | 100 | 100 | 100 |
| Curable composition for imprinting |  | V-1 | V-1 | V-1 | V-1 | V-1 | V-2 | V-1 | V-2 | V-1 | V-1 | V-1 |
| ΔHSP |  | 1.23 | 1.23 | 0.85 | 1.23 | 1.23 | 1.23 | 1.23 | 1.73 | 2.45 | 0.95 | 1.23 |
| Baking temperature |  | 180° C. | 180° C. | 180° C. | 180° C. | 180° C. | 180° C. | 180° C. | 180° C. | 180° C. | 180° C. | 180° C. |
| Thickness of underlayer film |  | 14 nm | 25 nm | 25 nm | 14 nm | 14 nm | 14 nm | 14 nm | 14 nm | 14 nm | 14 nm | 14 nm |
| Wettability of IJ liquid droplet |  | A | A | A | A | A | A | A | A | A | A | A |
| Filling properties |  | A | A | A | A | A | A | A | A | A | A | A |
| Adhesive force |  | B | A | B | A | A | A | A | A | A | A | A |
| Peeling defect |  | A | B | B | A | A | A | A | A | A | A | A |
| Coated surface condition |  | A | B | A | A | A | A | A | A | A | A | A |

TABLE 3

| | | Example 23 | Example 24 | Example 25 | Example 26 | Example 27 | Example 28 | Comparative Example 1 | Comparative Example 2 | Comparative Example 3 | Comparative Example 4 | Example 29 | Comparative Example 5 | Comparative Example 6 |
|---|---|---|---|---|---|---|---|---|---|---|---|---|---|---|
| Specific polymer | 1-1 | 0.2 | 0.1 | 0.4 | 0.2 | 0.2 | 0.2 | 0.2 | | 0.2 | 0.2 | | 0.2 | 0.2 |
| | 1-2 | | | | | | | | | | | 0.2 | | |
| | 1-9 | | | | | | | | 0.2 | | | | | |
| Specific compound | 2-1 | 0.198 | 0.099 | 0.398 | 0.198 | 0.198 | | | 0.198 | | | | | 0.198 |
| | 2-15 | | | | | | 0.198 | | | | | | | |
| Photopolymerization initiator | 3-1 | 0.002 | 0.001 | 0.002 | 0.002 | 0.002 | 0.002 | 0.002 | 0.002 | 0.002 | 0.002 | 0.002 | 0.002 | 0.002 |
| | 3-2 | | | | | | | | | | | | | |
| Solvent | 4-1 | 99.6 | 99.8 | 99.2 | 99.6 | 99.6 | 99.6 | 99.6 | 99.6 | 99.6 | 99.6 | 99.6 | 99.6 | 99.6 |
| | 4-2 | | | | | | | | | | | | | |
| Total | | 100 | 100 | 100 | 100 | 100 | 100 | 100 | 100 | 100 | 100 | 100 | 100 | 100 |
| Curable composition for imprinting | | V-1 | V-1 | V-1 | V-1 | V-1 | V-1 | V-1 | V-1 | V-1 | V-2 | V-1 | V-2 | V-3 |
| ΔHSP | | 1.23 | 1.23 | 1.23 | 1.23 | 1.23 | 1.68 | 12.15 | 1.23 | 1.20 | 0.67 | 2.15 | 3.88 | 4.54 |
| Baking temperature | | 180° C. | 180° C. | 180° C. | 150° C. | 220° C. | 180° C. | 180° C. | 180° C. | 180° C. | 180° C. | 180° C. | 180° C. | 180° C. |
| Thickness of underlayer film | | 14 nm | 14 nm | 14 nm | 14 nm | 14 nm | 14 nm | 14 nm | 14 nm | 14 nm | 14 nm | 14 nm | 14 nm | 14 nm |
| Wettability of IJ liquid droplet | | A | A | A | A | A | A | D | A | C | C | B | D | D |
| Filling properties | | A | A | A | A | A | A | C | A | D | D | B | C | D |
| Adhesive force | | A | A | A | A | A | B | A | C | B | B | B | A | A |
| Peeling defect | | A | A | A | A | A | B | A | D | B | B | B | B | A |
| Coated surface condition | | A | A | A | A | A | B | A | B | A | A | A | A | A |

4-2: γ-Butyrolactone

TABLE 4

| | Boiling point | V-1 | V-2 | V-3 |
|---|---|---|---|---|
| 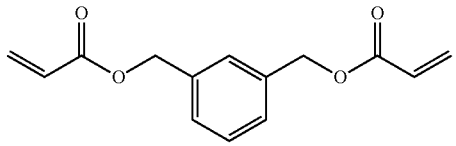 [SMILES: C=CC(=O)OCc1cccc(COC(=O)C=C)c1] | 329 | 60 | 63 | |
| 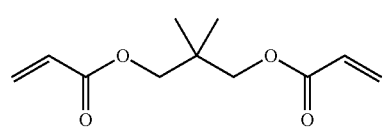 | 248.5 | 20 | | |
| 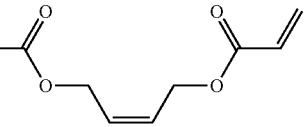 | 251 | 22 | | |
| 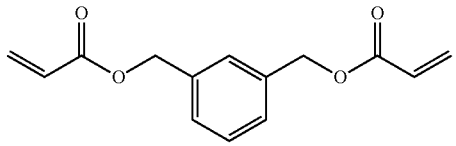 [SMILES: C=CC(=O)OCc1cccc(COC(=O)C=C)c1] | 283 | | 50 | |
| 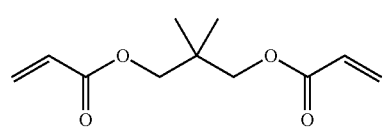 | 296.5 | 20 | 15 | |

TABLE 4-continued

| | Boiling point | V-1 | V-2 | V-3 |
|---|---|---|---|---|
| 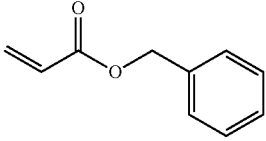 | 231.9 | | | 40 |
| 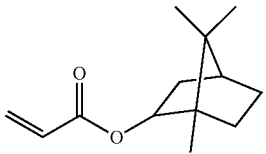 | 246 | | | 10 |
| 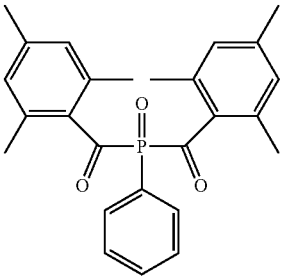 [SMILES: Cc1cc(C)c(C(=O)P(=O)(C(=O)c2c(C)cc(C)cc2C)c2ccccc2)c(C)c1] | — | 2 | 2 | 2 |
| 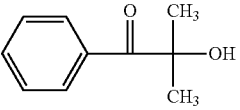 | — | | 2 | 2 |
| 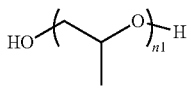 | — | 3 | | |
| 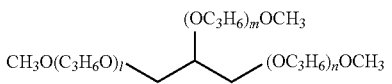 | — | | 3 | |
| Fuluorine-based surfactant (Capstone FS-3100) | — | | | 1 |
| Viscosity at 23 °C. (mPa · s) | | 8 | 7 | 7 |
| Surface tention at 23° C. (mN/m) | | 33.0 | 34.0 | 30.0 |
| d component | | 18.1 | 18.1 | 16.2 |
| p component | | 4.5 | 4.5 | 4.1 |
| h component | | 5.9 | 5.9 | 5.7 |

The unit of the formulation amount is parts by mass

The unit of the boiling point is ° C. (1013.25 hPa) (hereinafter, the same applies) n1: (12), m + n + l: 12

The d component, the p component, and the h component are a d component, a p component, and a h component of the Hansen solubility parameter vector

TABLE 5

| | Structural formula | Mw |
|---|---|---|
| 1-1 | (structure) | 20000 |
| 1-2 | (structure) | 5000 |
| 1-3 | (structure) | 30000 |

TABLE 5-continued

| | Structural formula | Mw |
|---|---|---|
| 1-4 | (structure) | 10000 |

Mw: Weight-average molecular weight

TABLE 6

| | Structural formula | Mw |
|---|---|---|
| 1-5 | (structure) | 20000 |
| 1-6 | (structure) | 20000 |

TABLE 6-continued

| | Structural formula | Mw |
|---|---|---|
| 1-7 | (structure) | 20000 |
| 1-8 | (structure) | 2500 |
| 1-9 | (structure) | 20000 |

Mw: Weight-average molecular weight

| | Left constitutional unit | Right constitutional unit |
|---|---|---|
| 1-2 | 80 | 20 |
| 1-3 | 90 | 10 |
| 1-4 | 95 | 5 |
| 1-6 | 50 | 50 |

TABLE 7

| | Structural formula | Viscosity | Surface tension | Boiling point | d component | p component | h component |
|---|---|---|---|---|---|---|---|
| 2-1 | (structure) | 680 | 41 | 483 | 18.4 | 4.9 | 4.9 |
| 2-2 | (structure) | 1550 | 39 | 618 | 18.5 | 6.0 | 5.6 |

TABLE 7-continued

| | Structural formula | Viscosity | Surface tension | Boiling point | d component | p component | h component |
|---|---|---|---|---|---|---|---|
| 2-3 | (structure with NO$_2$ group, triacrylate) | 1100 | 38 | 506 | 17.0 | 5.1 | 6.8 |
| 2-4 | (diphenyl ether tetraacrylate structure) | 980 | 43 | 526 | 18.3 | 5.2 | 5.4 |

The unit of the viscosity is mPa · s (refer to the text for measurement conditions) (hereinafter, the same applies)

The unit of the surface tension is mN/m (refer to the text for measurement conditions) (hereinafter, the same applies)

The enlarged structural formulae of the compounds 2-2 and 2-3 are shown below

TABLE 8

| | Structural formula | Viscosity | Surface tension | Boiling point | d component | p component | h component |
|---|---|---|---|---|---|---|---|
| 2-5 | (triphenylmethane triacrylate structure) | 2200 | 39 | 614 | 18.5 | 6.6 | 6.1 |

TABLE 8-continued

| | Structural formula | Viscosity | Surface tension | Boiling point | d component | p component | h component |
|---|---|---|---|---|---|---|---|
| 2-6 | | 980 | 37 | 531 | 15.9 | 5.3 | 7.0 |
| 2-7 | | 1200 | 39 | 526 | 17.7 | 5.7 | 5.6 |
| 2-8 | | 1440 | 39 | 623 | 18.1 | 7 | 6 |

The enlarged structural formulae of the compounds 2-5 to 2-8 are shown below

TABLE 9

| | Structural formula | Viscosity | Surface tension | Boiling point | d component | p component | h component |
|---|---|---|---|---|---|---|---|
| 2-9 | | 120 | 42 | 895 | 12.6 | 8.3 | 9.4 |

TABLE 9-continued

| | Structural formula | Viscosity | Surface tension | Boiling point | d component | p component | h component |
|---|---|---|---|---|---|---|---|
| 2-10 | | 111 | 42 | 411 | 18.6 | 5.1 | 5.6 |
| 2-11 | | 42 | 40 | 399 | 18.1 | 4.8 | 6.5 |
| 2-12 | | 180 | 40 | 487 | 17.2 | 5.6 | 6.3 |

The enlarged structural formula of the compound 2-11 is shown below

TABLE 10

| | Structural formula |
|---|---|
| 2-13 | |

TABLE 10-continued
2-14
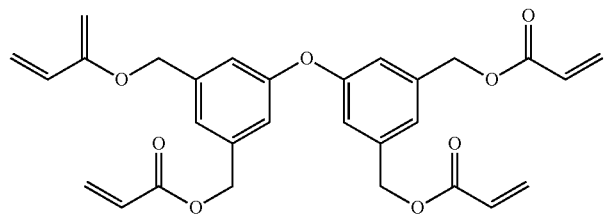
2-15
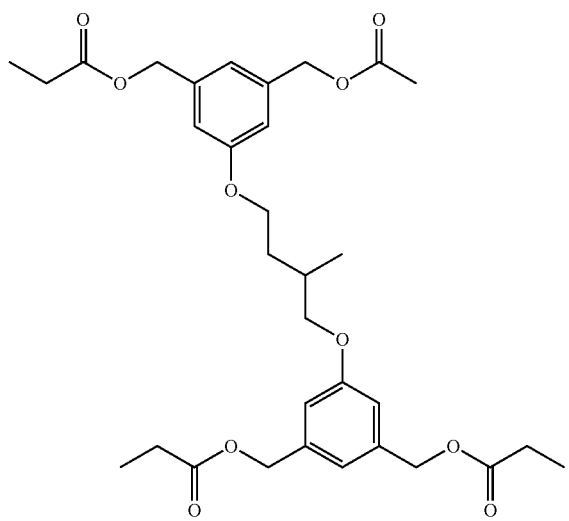
|  | Viscosity | Surface tension | Boiling point | d component | p component | h component |
|---|---|---|---|---|---|---|
| 2-13 | 1390 | 41 | 563 | 17.0 | 7.7 | 5.8 |
| 2-14 | 610 | 39 | 494 | 18.1 | 5.3 | 5.6 |
| 2-15 | 580 | 38 | 510 | 17.7 | 5.5 | 5.6 |
The compounds 2-13 and 2-15 which are enlarged are shown below
TABLE 11
Structural formula
3-1
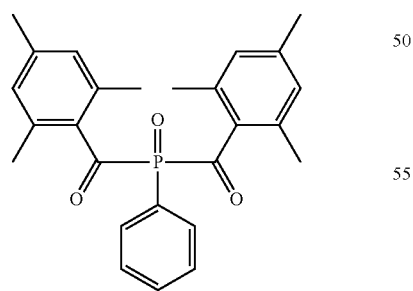
3-2
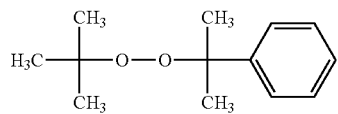

Compound 1-5
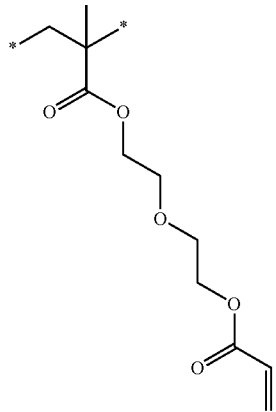 [SMILES: *CC(*)(C)C(=O)OCCOCCOC(=O)C=C]
Compound 1-6
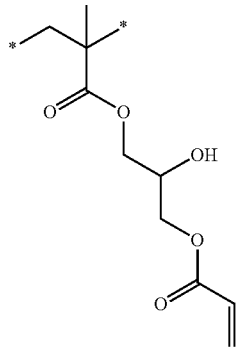 [SMILES: *CC(*)(C)C(=O)OCC(O)COC(=O)C=C]
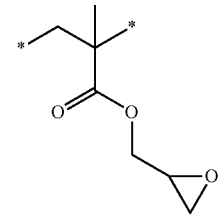
Compound 1-8
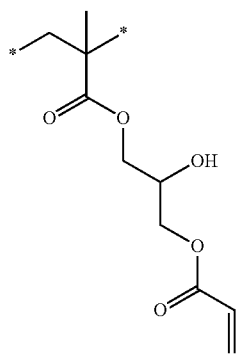
Compound 1-9
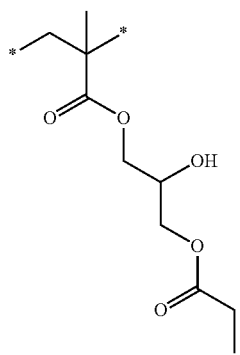 [SMILES: *CC(*)(C)C(=O)OCC(O)COC(=O)CC]
Compound 2-2
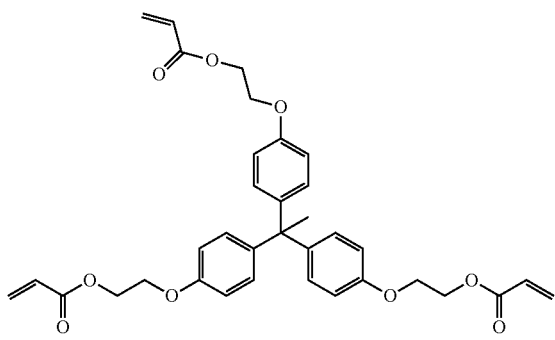
Compound 2-3
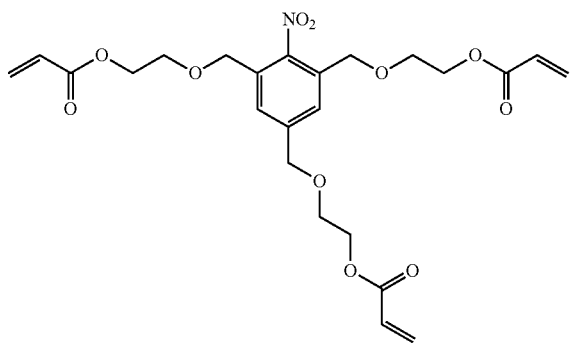 [SMILES: C=CC(=O)OCCOCc1cc(COCCOC(=O)C=C)c([N+](=O)[O-])c(COCCOC(=O)C=C)c1]

-continued
Compound 2-5
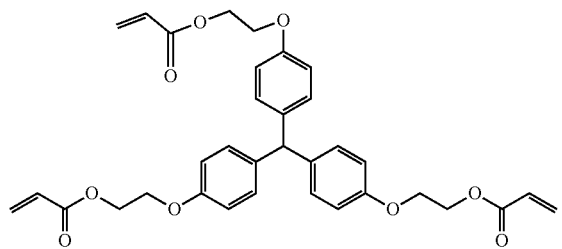
Compound 2-6
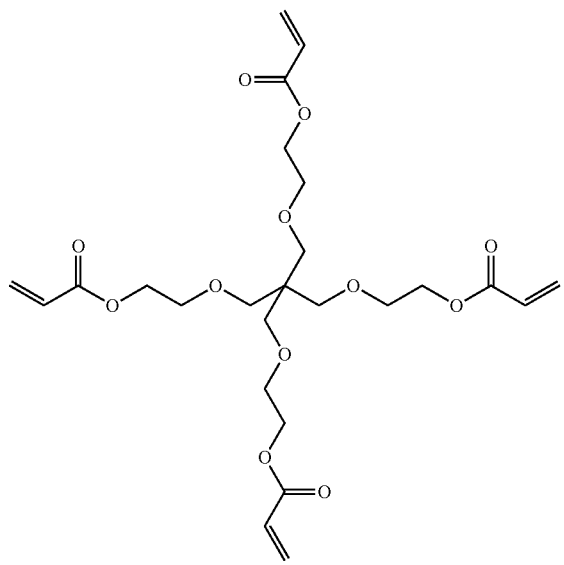 [SMILES: C=CC(=O)OCCOCC(COCCOC(=O)C=C)(COCCOC(=O)C=C)COCCOC(=O)C=C]
Compound 2-7
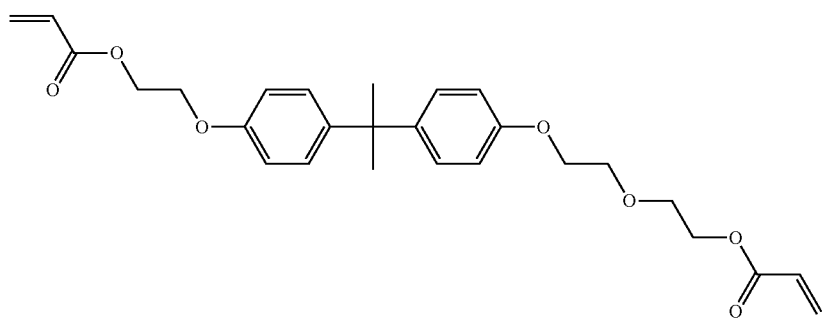 [SMILES: C=CC(=O)OCCOCCOc1ccc(C(C)(C)c2ccc(OCCOC(=O)C=C)cc2)cc1]
Compound 2-8
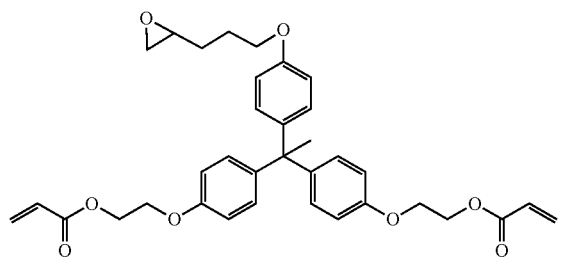
Compound 2-11
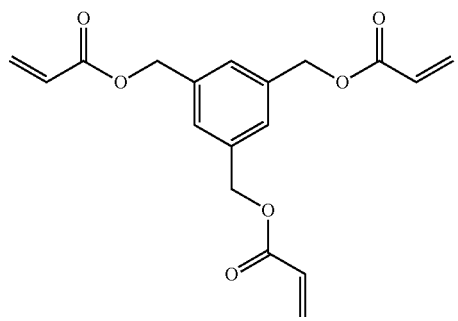 [SMILES: C=CC(=O)OCc1cc(COC(=O)C=C)cc(COC(=O)C=C)c1]
Compound 2-13
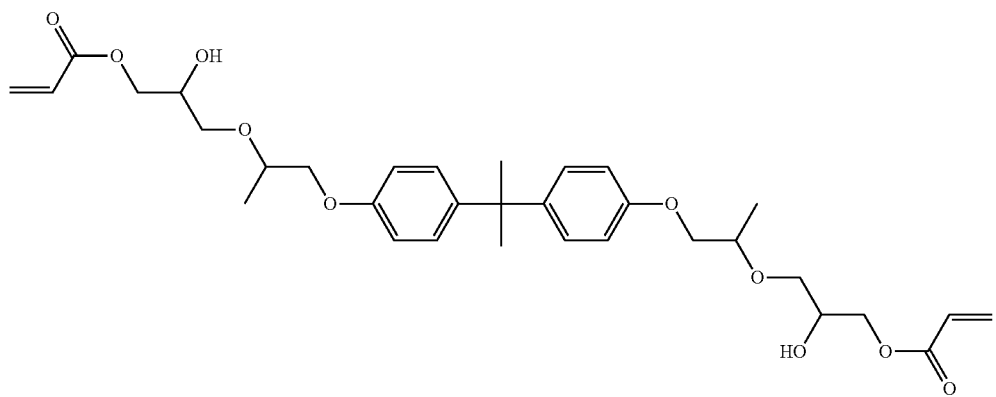 [SMILES: C=CC(=O)OCC(O)COC(C)COc1ccc(C(C)(C)c2ccc(OCC(C)OCC(O)COC(=O)C=C)cc2)cc1]

-continued

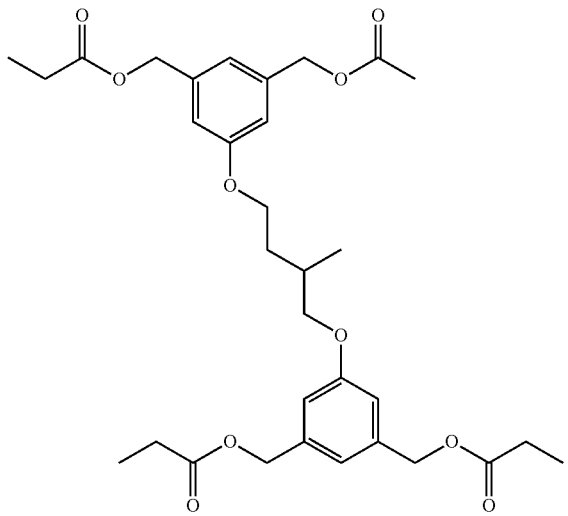 [SMILES: CCC(=O)OCc1cc(COC(C)=O)cc(OCCC(C)COc2cc(COC(=O)CC)cc(COC(=O)CC)c2)c1]

Compound 2-15

As is clear from the above results, in a case where the underlayer film was formed by using the polymer having a polymerizable functional group and the specific compound in the composition for forming an underlayer film for imprinting, high wettability of the curable composition for imprinting with respect to the underlayer film was brought about and adhesiveness to the film (cured film) formed of the curable composition for imprinting was excellent (Examples 1 to 29).

On the other hand, in a case (Comparative Examples 1, 5, and 6) where the compound combined with the polymer did not satisfy the value of ΔHSP, and in a case (Comparative Examples 3 and 4) where the boiling point of the compound was low, the wettability was poor. In Comparative Example 2, the specific polymer did not have a polymerizable functional group, and the adhesiveness and the resistance to the peeling defect were poor.

In addition, it was found that in the preferred embodiment of the present invention, not only the wettability but also the filling properties, the adhesive force, the peeling defect, and the coated surface condition could be made particularly excellent.

EXPLANATION OF REFERENCES

1: Substrate
2: Underlayer film
3: Curable composition for imprinting
4: Mold
21: Underlayer film
22: Curable composition for imprinting

What is claimed is:

1. A kit comprising:
a curable composition for imprinting; and
a composition for forming an underlayer film for imprinting,
wherein the composition for forming the underlayer film for imprinting contains a polymer having a polymerizable functional group, and a compound in which a lower one of a boiling point and a thermal decomposition temperature is 480° C. or higher and ΔHSP, which is a Hansen solubility parameter distance from a component with a highest content contained in the curable composition for imprinting, is 0 to 2.5, and
ΔHSP which is the Hansen solubility parameter distance is derived by Expression (1), $$\Delta HSP = [4.0 \times (\Delta D^2 + \Delta P^2 + \Delta H^2)]^{0.5}$$ Expression (1)

ΔD: a difference between a dispersion element component of a Hansen solubility parameter vector of the component with the highest content contained in the curable composition for imprinting and a dispersion element component of the Hansen solubility parameter vector of the compound contained in the composition for forming the underlayer film for imprinting,
ΔP: a difference between a polarity element component of the Hansen solubility parameter vector of the component with the highest content contained in the curable composition for imprinting and a polarity element component of the Hansen solubility parameter vector of the compound contained in the composition for forming the underlayer film for imprinting, and
ΔH: a difference between a hydrogen bond element component of the Hansen solubility parameter vector of the component with the highest content contained in the curable composition for imprinting and a hydrogen bond element component of the Hansen solubility parameter vector of the compound contained in the composition for forming the underlayer film for imprinting.

2. The kit according to claim 1,
wherein the compound contained in the composition for forming the underlayer film for imprinting has a plurality of groups capable of polymerizing with the polymerizable functional group of the polymer in one molecule.

3. The kit according to claim 1,
wherein at least one of the polymer or the compound contained in the composition for forming the underlayer film for imprinting has a polar functional group.

4. The kit according to claim 3,
wherein the polar functional group has at least one kind selected from the group consisting of a sulfonyl group-containing group, a sulfonic acid group, a phosphoric acid group, and a hydroxyl group.

5. The kit according to claim 1,
wherein the polymerizable functional group of the polymer is a (meth)acryloyl group.

6. The kit according to claim 1,
wherein the polymer is an acrylic resin.

7. The kit according to claim 1,
wherein a weight-average molecular weight of the polymer is 4,000 to 200,000.

8. The kit according to claim 1,
wherein a viscosity of the compound contained in the composition for forming the underlayer film for imprinting at 23° C. is 5 to 2,000 m·Pas.

9. The kit according to claim 1,
wherein surface tension of the compound contained in the composition for forming the underlayer film for imprinting at 23° C. is 38 to 43 mN/m.

10. The kit according to claim 1,
wherein the compound contained in the composition for forming the underlayer film for imprinting has three groups capable of polymerizing with the polymerizable functional group of the polymer in a molecule.

11. The kit according to claim 2,
wherein the groups capable of polymerizing with the polymerizable functional group of the polymer are (meth)acryloyl groups.

12. The kit according to claim 1,
wherein an amount of the compound contained in the composition for forming the underlayer film for imprinting is 25 parts by mass to 400 parts by mass with respect to 100 parts by mass of the polymer.

13. The kit according to claim 1,
wherein the composition for forming the underlayer film for imprinting further contains at least one kind of a thermal polymerization initiator or a photopolymerization initiator.

14. The kit according to claim 1,
wherein the composition for forming the underlayer film for imprinting further contains a solvent, and the solvent accounts for 99.0% by mass or more of the composition for forming the underlayer film for imprinting.

15. The kit according to claim 1,
wherein a difference between a boiling point of a component with a largest formulation amount in the curable composition for imprinting and a boiling point of the compound contained in the composition for forming the underlayer film for imprinting is 150 to 300° C.

16. The kit according to claim 1,
wherein surface tension of the compound contained in the composition for forming the underlayer film for imprinting is higher than surface tension of a component with a largest formulation amount in the curable composition for imprinting.

17. A composition for forming an underlayer film for imprinting, which is used in combination with a curable composition for imprinting,
wherein the composition for forming the underlayer film for imprinting contains a polymer having a polymerizable functional group, and a compound in which a lower one of a boiling point and a thermal decomposition temperature is 480° C. or higher and ΔHSP, which is a Hansen solubility parameter distance from a component with a highest content contained in the curable composition for imprinting is 0 to 2.5, and ΔHSP which is the Hansen solubility parameter distance is derived by Expression (1), $$\Delta HSP=[4.0\times(\Delta D^2+\Delta P^2+\Delta H^2)]^{0.5} \quad \text{Expression (1)}$$

ΔD: a difference between a dispersion element component of a Hansen solubility parameter vector of the component with the highest content contained in the curable composition for imprinting and a dispersion element component of the Hansen solubility parameter vector of the compound contained in the composition for forming the underlayer film for imprinting, ΔP: a difference between a polarity element component of the Hansen solubility parameter vector of the component with the highest content contained in the curable composition for imprinting and a polarity element component of the Hansen solubility parameter vector of the compound contained in the composition for forming the underlayer film for imprinting, and ΔH: a difference between a hydrogen bond element component of the Hansen solubility parameter vector of the component with the highest content contained in the curable composition for imprinting and a hydrogen bond element component of the Hansen solubility parameter vector of the compound contained in the composition for forming the underlayer film for imprinting.

18. The composition for forming the underlayer film for imprinting according to claim 17,
wherein the compound contained in the composition for forming the underlayer film for imprinting has a plurality of groups capable of polymerizing with the polymerizable functional group of the polymer in a molecule.

19. A pattern forming method comprising:
a step of applying the composition for forming the underlayer film for imprinting contained in the kit according to claim 1 to a substrate to form the underlayer film for imprinting;
a step of applying the curable composition for imprinting contained in the kit to the underlayer film for imprinting;
a step of exposing the curable composition for imprinting in a state where a mold is brought into contact with the curable composition for imprinting; and
a step of peeling off the mold.

20. The pattern forming method according to claim 19,
wherein the step of forming the underlayer film for imprinting includes a spin coating method.

21. The pattern forming method according to claim 19,
wherein the step of applying the curable composition for imprinting includes an ink jet method.

22. A method for manufacturing a semiconductor device, comprising:
the pattern forming method according to claim 19.

* * * * *